United States Patent
Lu et al.

(10) Patent No.: US 9,685,367 B2
(45) Date of Patent: Jun. 20, 2017

(54) PHOTOMASK FOR FORMING MULTIPLE LAYER PATTERNS WITH A SINGLE EXPOSURE

(71) Applicant: Taiwan Semiconductor Manufacturing Company, Ltd., Hsin-Chu (TW)

(72) Inventors: Yen-Cheng Lu, New Taipei (TW); Chih-Tsung Shih, Hsinchu (TW); Shinn-Sheng Yu, Hsinchu (TW); Jeng-Horng Chen, Hsin-Chu (TW); Anthony Yen, Hsinchu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 15/394,466

(22) Filed: Dec. 29, 2016

(65) Prior Publication Data

US 2017/0110366 A1    Apr. 20, 2017

Related U.S. Application Data

(63) Continuation of application No. 14/030,755, filed on Sep. 18, 2013, now Pat. No. 9,535,316, which is a continuation-in-part of application No. 13/906,795, filed on May 31, 2013, now Pat. No. 8,791,024.

(60) Provisional application No. 61/823,312, filed on May 14, 2013.

(51) Int. Cl.
| | | |
|---|---|---|
| *H01L 21/033* | (2006.01) | |
| *H01L 21/768* | (2006.01) | |
| *G03F 7/095* | (2006.01) | |
| *G03F 7/039* | (2006.01) | |
| *H01L 21/311* | (2006.01) | |
| *G03F 7/20* | (2006.01) | |
| *G03F 1/22* | (2012.01) | |

(52) U.S. Cl.
CPC .......... *H01L 21/76817* (2013.01); *G03F 1/22* (2013.01); *G03F 7/039* (2013.01); *G03F 7/095* (2013.01); *G03F 7/2004* (2013.01); *H01L 21/0332* (2013.01); *H01L 21/31111* (2013.01); *H01L 21/31144* (2013.01); *H01L 21/76811* (2013.01); *H01L 21/76877* (2013.01)

(58) Field of Classification Search
None
See application file for complete search history.

(56) References Cited

U.S. PATENT DOCUMENTS

| | | |
|---|---|---|
| 6,140,226 A | 10/2000 | Grill et al. |
| 7,229,745 B2 | 6/2007 | Lamarre et al. |
| 8,791,024 B1 | 7/2014 | Lu et al. |
| 9,081,312 B2 | 7/2015 | Lu et al. |
| 9,091,931 B2 | 7/2015 | Kojima et al. |

(Continued)

OTHER PUBLICATIONS

Office Action mailed Aug. 28, 2015 issued by the Korean Patent Office in Korean Patent Application No. 10-2014-0057319, 10 pgs.

*Primary Examiner* — Cheung Lee
(74) *Attorney, Agent, or Firm* — Haynes and Boone, LLP

(57) ABSTRACT

The present disclosure provides one embodiment of a mask for a lithography exposure process. The mask includes a mask substrate; a first mask material layer patterned to have a first plurality of openings that define a first layer pattern; and a second mask material layer patterned to have a second plurality of openings that define a second layer pattern.

20 Claims, 21 Drawing Sheets

(56) References Cited

U.S. PATENT DOCUMENTS

2002/0012851 A1 1/2002 Coronel et al.
2010/0255409 A1 10/2010 Kang et al.

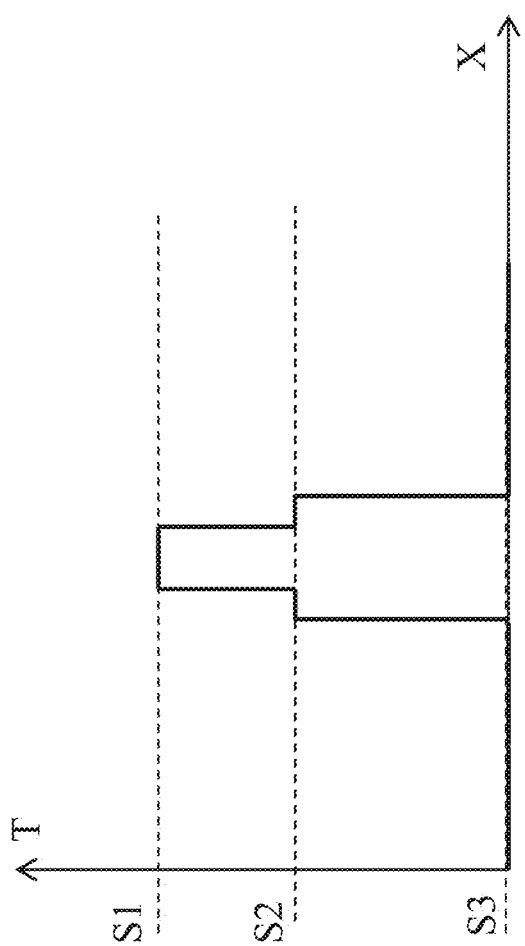

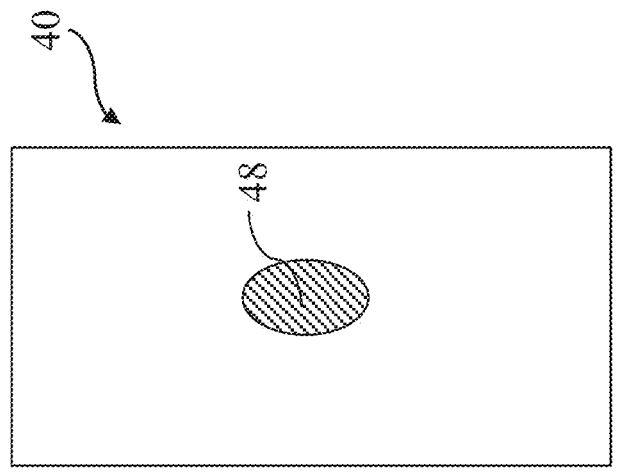
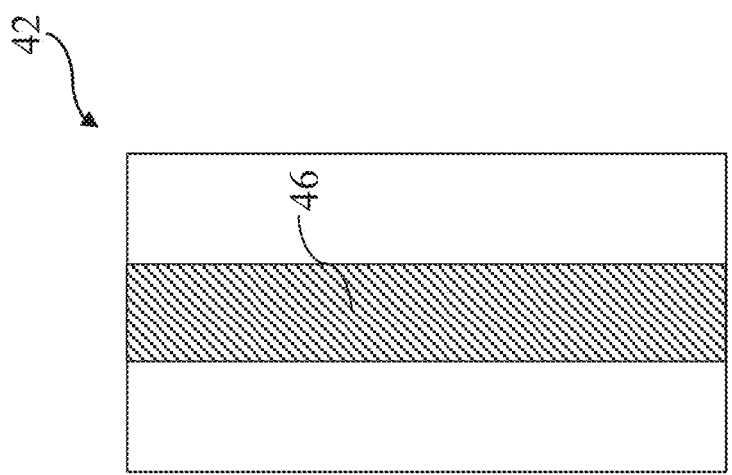

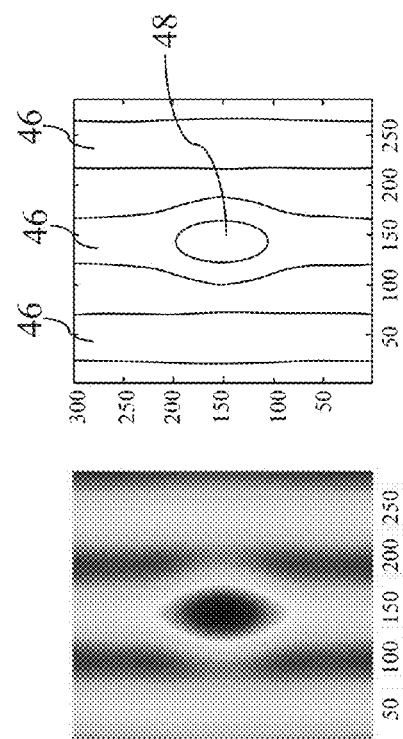
Fig. 25
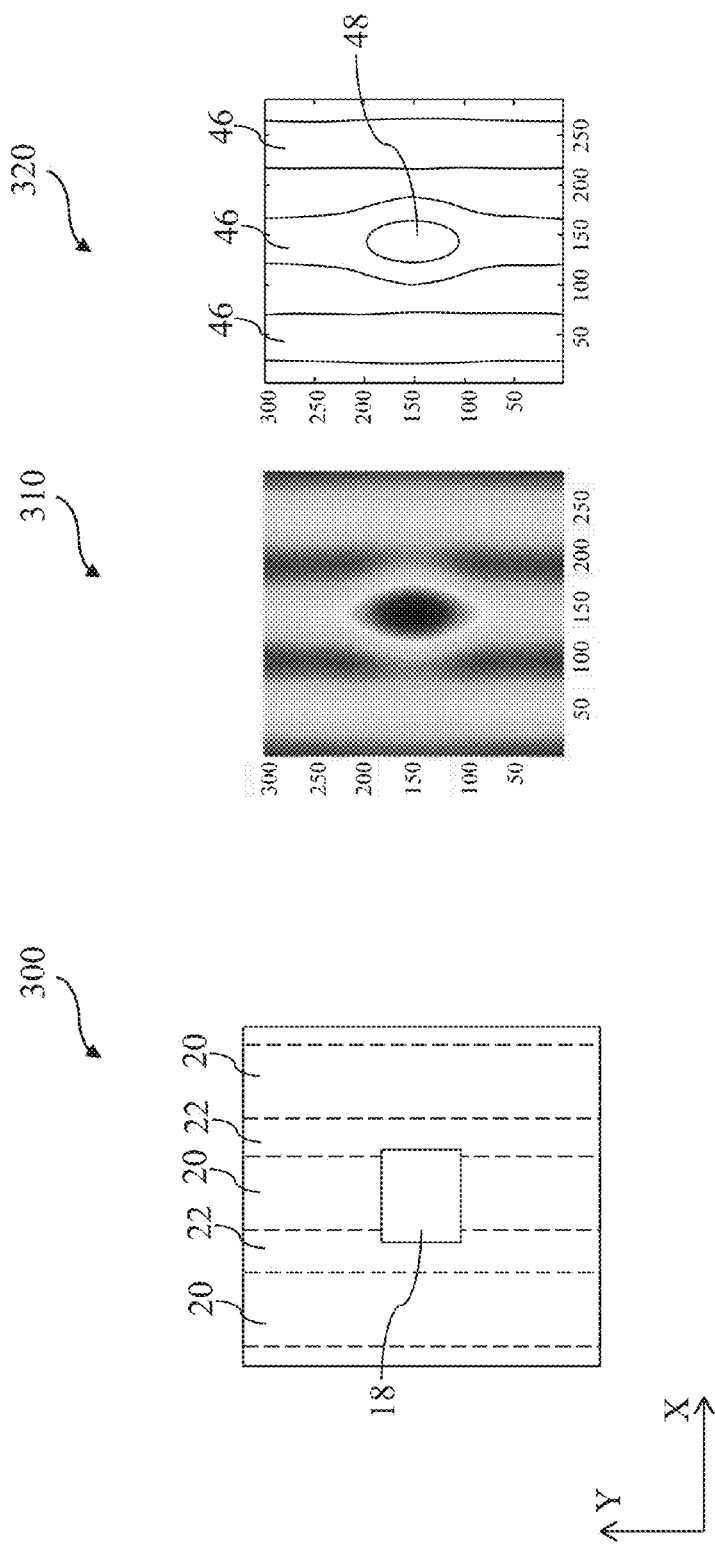
Fig. 24
Fig. 23

PHOTOMASK FOR FORMING MULTIPLE LAYER PATTERNS WITH A SINGLE EXPOSURE

CROSS-RELATED

This patent is a continuation of U.S. Ser. No. 14/030,755 entitled "Photomask With Three States for Forming Multiple Layer Patterns with a Single Exposure," which was filed on Sep. 18, 2013 issuing as U.S. Pat. No. 9,535,316, which is a continuation-in-part of U.S. Ser. No. 13/906,795 entitled "Method To Define Multiple Layer Patterns Using A Single Exposure," filed May 31, 2013, and claims the benefit of U.S. Provisional Application Ser. No. 61/823,312 entitled "Method to Define Multiple Layer Patterns Using a Single Exposure," filed May 14, 2013. The entire disclosures all are hereby incorporated by reference.

This application is also related to U.S. patent application Ser. No. 14/030,875, filed on Sep. 18, 2013, and entitled "Method to Define Multiple Layer Patterns with a Single Exposure by E-Beam Lithography", the disclosure of which is hereby incorporated by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

ICs are commonly formed by a sequence of material layers, some of which are patterned by a photolithography process. It is important that the patterned layers properly align or overlay with adjacent layers. Proper alignment and overlay becomes more difficult in light of the decreasing geometry sizes of modern ICs. In addition, the surface topography of an underlying substrate, such as a semiconductor wafer, impacts the lithography imaging quality and further degrades the overlay tolerance between adjacent material layers. Furthermore, lithography processes are a significant contributor to the overall cost of manufacturing, including processing time and the cost of masks (also referred to as photomasks) used in the process. Therefore, what is needed is a lithography method to address the above issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 3 diagrammatically illustrates a transmittance profile of the photomask of FIG. 1.

FIGS. 6 and 7 are top views of latent resist patterns in respective resist layers using the photomask of FIG. 1.

FIG. 23 is a top view of a photomask constructed according to aspects of the present disclosure in another embodiment.

FIG. 24 diagrammatically illustrates an exposure intensity profile in a lithography exposure process using the photomask of FIG. 23.

FIG. 25 is a top view of latent resist patterns in respective resist layers using the photomask of FIG. 23.

DETAILED DESCRIPTION

Figure 1:
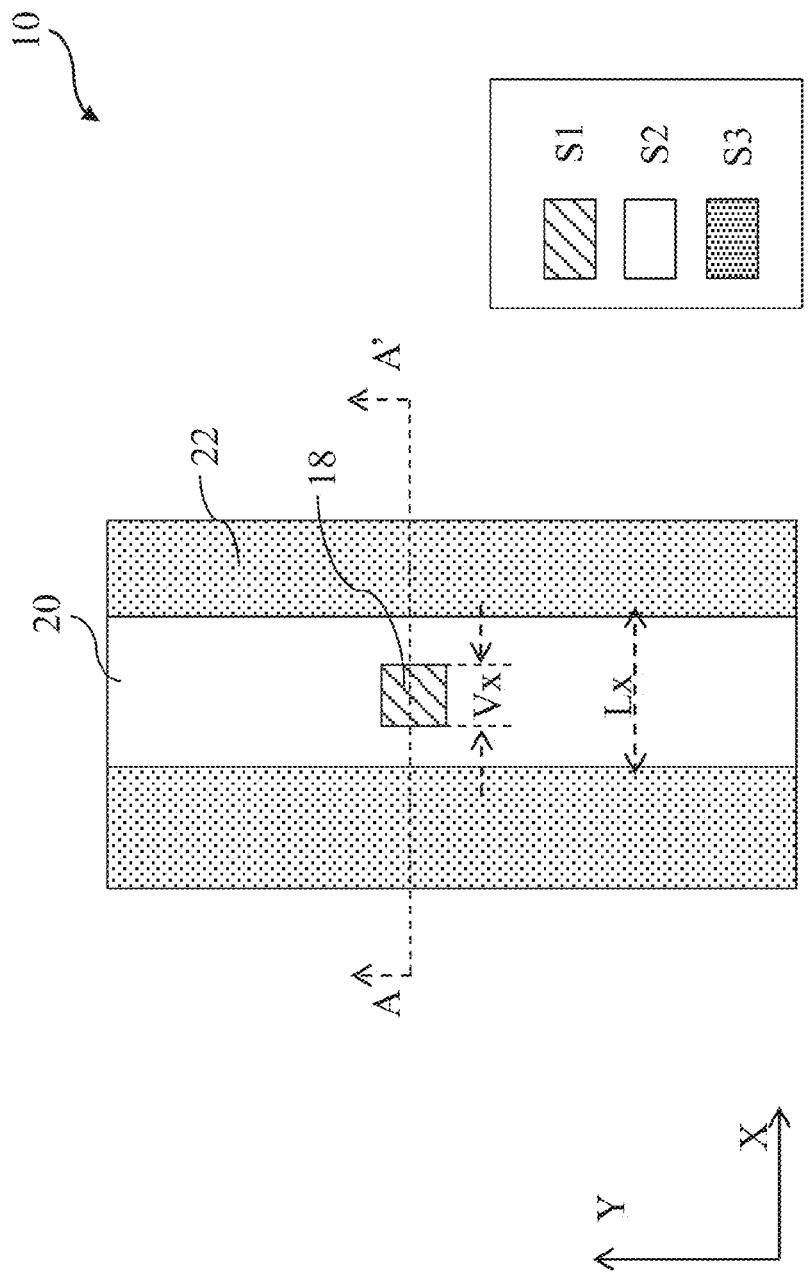
FIG. 1 is a top view of a photomask constructed according to aspects of the present disclosure in one embodiment.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 2:
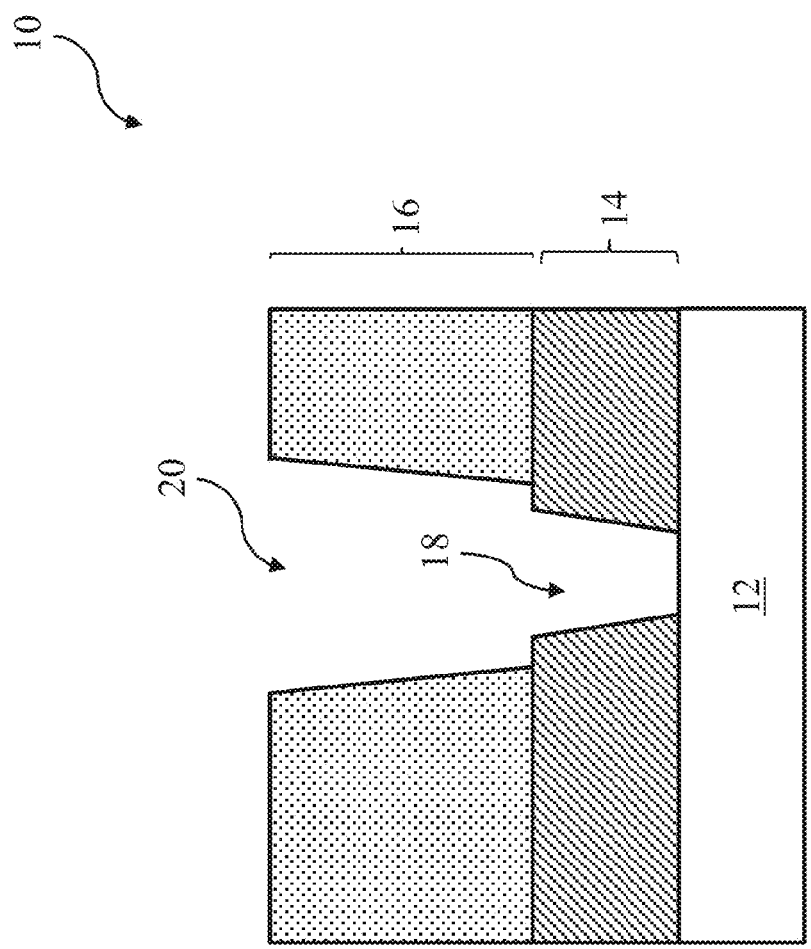
FIG. 2 is a sectional view of the photomask of FIG. 1.

FIG. 1 is a top view of a photomask (reticle or mask) 10 and FIG. 2 is a sectional view of the photomask 10 along the dashed line AA' constructed according to one embodiment. The mask 10 is used to pattern two or more resist layers by a single lithography exposure (or exposing, the terms "exposing" and "exposure" are often used exchangeably) process, such as ultraviolet (UV) lithography, or deep UV (DUV) lithography.

The mask 10 includes a mask substrate 12 having a first transmittance S1 to the exposure radiation (such as ultraviolet-UV beam, or deep UV-DUV beam) during a lithography exposure process using the mask 10. In the present embodiment, the mask substrate 12 is a transparent substrate, such as a fused quartz substrate. In furtherance of the present embodiment, the first transmittance S1 is assigned to be 100% and transmittances S2 and S3 are defined relative to S1.

The mask 10 includes a first mask material layer 14 disposed on the mask substrate 12. The first mask material layer 14 has a second transmittance S2 to the exposure radiation. The second transmittance S2 is less than the first transmittance S1. In the present example, the second transmittance S2 ranges between about 20% and about 80%. The first mask material layer 14 partially attenuates the exposure radiation. The transmittance of the first mask material layer 14 is determined by its composition and thickness. In the present embodiment, the first mask material layer 14 includes molybdenum silicon (MoSi). Furthermore, the first mask material layer 14 is deposited with the ratio of Mo and Si tuned for desired refractive index (n) and the extinction coefficient (k) according to the wavelength of the exposure radiation. The first mask material layer 14 is designed to have a suitable thickness for expected transmittance. In one example, the first mask material layer 14 has a thickness ranging between about 5 nm and about 40 nm. Alternatively, the first mask material layer 14 includes other attenuating material, such as zirconium silicon oxide (ZrSiO), silicon nitride (SiN), and/or titanium nitride (TiN).

The mask 10 includes a second mask material layer 16 disposed on the first mask material layer 14. The second mask material layer 16 has a third transmittance S3 to the exposure radiation. The third transmittance S3 is less than the second transmittance S2. In the present example, the second mask material layer 16 substantially attenuates the exposure radiation and the third transmittance S3 is around 0% or less than 6%. In the present embodiment, the second mask material layer 16 includes chromium (Cr). In one example, the second mask material layer 16 of Cr has a thickness ranging between about 5 nm and about 80 nm. Alternatively, the second mask material layer 16 may include other suitable attenuating material.

As mentioned above, the transmittances S2 and S3 are defined relative to S1. In the present embodiment, state differently, the third transmittance S3 is less than 6% of the first transmittance S1 and the second transmittance S2 ranges between about 20 and about 80% of the first transmittance S1.

The mask 10 may include a capping layer formed on the second mask material layer to prevent the reflection during the lithography exposure process using the mask 10. For one example, the capping layer includes MoSi and is patterned with the second mask material layer 16.

The first and second mask material layers 14 and 16 are patterned to form various features having respective transmittances S1, S2 and S3. Therefore, the mask 10 is also referred to as 3-state mask. Various features in different mask states (or states) response differently to the exposure radiation during a lithography exposure process using the mask 10.

The first and second mask material layers are patterned to form various trenches (openings) according to an integrated circuit (IC) pattern having two layer patterns. Particularly, the first mask material layer 14 is patterned according to a first layer pattern and the second mask material layer 16 is patterned according to a second layer pattern. As an example for illustration, the first mask material layer 14 is patterned to form one or more openings 18. The second mask material layer 16 is patterned to form one or more openings 20.

Various openings in the mask 10 define various features in the IC pattern. In the present embodiment, the opening 18 defines a first feature (also referred by the numeral 18) in a first layer pattern of the integrated circuit, and the opening 20 defines a second feature (also referred by the numeral 20) in a second layer pattern of the integrated circuit. The first layer pattern and the second layer pattern are portion of the integrated circuit. For example, the first layer pattern is a via pattern having one or more via features and the second layer pattern is a metal line pattern having one or more metal lines. The via pattern and the metal line pattern are collectively a portion of an interconnect structure in the integrated circuit.

Especially, various features in the mask 10 are assigned to respective states. The first feature 18 in the first layer pattern is associated to a first state having the first transmittance S1. The feature 20 in the second layer pattern is associated to a second state having the second transmittance S2. The region without pattern is referred to as field 22. The field is associated with the third state having the first transmittance S3.

Various features from the first and second layer patterns are combined together and collectively defined in the mask 10. Particularly, the first layer pattern and the second layer pattern are properly combined according to the corresponding spatial relationship there-between when both are formed on a semiconductor wafer. In the present example, the first feature 18 is aligned with the second feature 20 for proper electrical routing of the interconnect structure when both are formed on the semiconductor wafer. In the mask 10, the first feature 18 is overlapped with the second feature 20, as illustrated in FIG. 1.

In the present embodiment, the first feature 18 has a first dimension Vx in the X direction and the second feature 20 has a second dimension Lx in the X direction. Vx is less than Lx. The second feature 20 is a line feature oriented in the Y direction perpendicular to the X direction.

The mask 10 is formed by a suitable procedure. In one embodiment, the first and second mask material layers are sequentially deposited by a suitable method, such as physical vapor deposition (PVD). Then the second mask material layer 16 is patterned by a lithography patterning procedure that includes resist coating, lithography exposure, developing, etching, and resist removal. Similarly, the first mask material layer 14 is patterned by another lithography patterning procedure. Alternatively, the mask 10 may be formed by the method disclosed in the patent application (client number 2013-0782/20461.2605) hereby incorporated. Particularly, the mask material layers disposed on the mask substrate 12 are patterned using an e-beam lithography exposure process according to a dosage map having three dosage levels, which respectively define the first feature 18, the second feature 20 and the field 22.

FIG. 3 further diagrammatically illustrates a transmittance profile of the mask 10 along the dashed line A-A'. The vertical axis represents the transmittance "T" and the horizontal axis represents a dimension along the X direction.

The mask 10 is used by a lithography patterning process. Various features in the mask 10 are transferred to two or more resist layers, respectively, by a single lithography exposure process.

Figure 8:
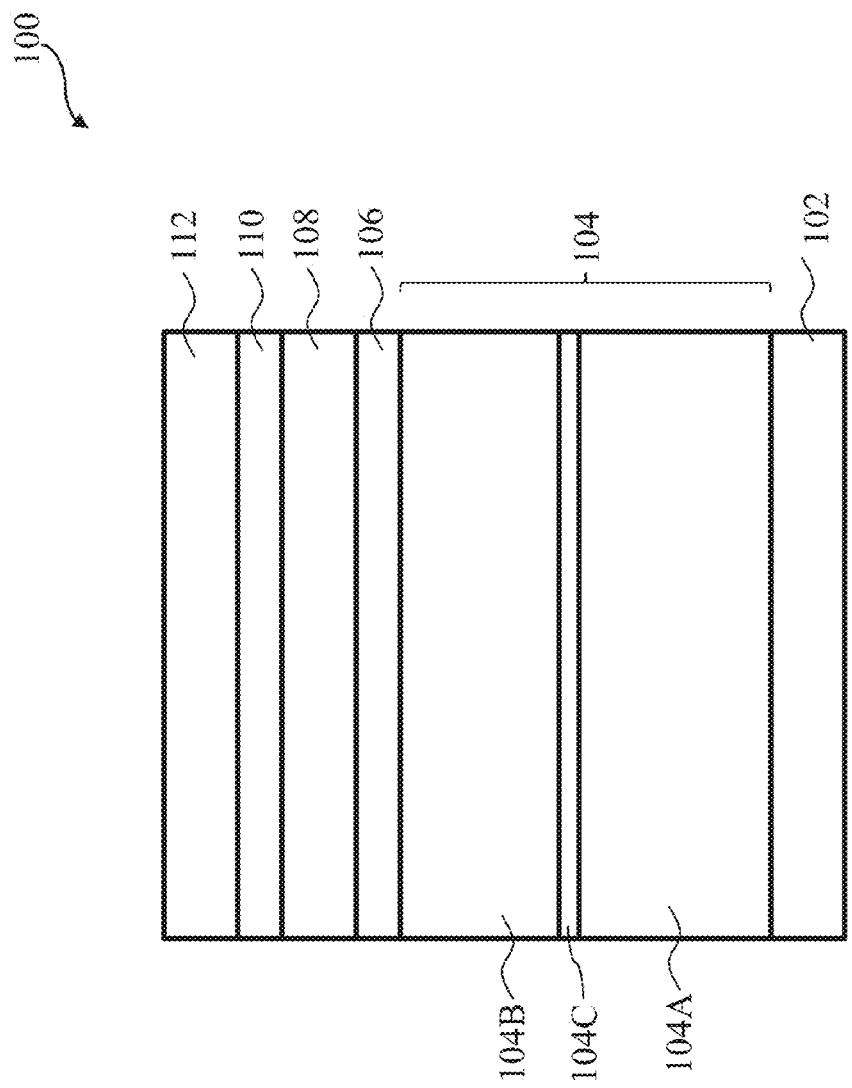
FIGS. 8 through 20 are sectional views of a semiconductor structure at various fabrication stages constructed according to one or more embodiments of the present disclosure and using the photomask of FIG. 1.

FIG. 8 is a sectional view of a semiconductor structure 100 to be patterned by a lithography patterning process using the mask 10. The mask 10, the semiconductor structure 100, and the method for patterning the semiconductor structure 100 are collectively described in detail with reference to FIGS. 1-8.

The structure 100 includes a substrate 102 and a material layer 104 disposed on the substrate 102. The material layer 104 may include multiple films with same or different materials according to different embodiments. In one example, the material layer 104 includes a first dielectric material layer and a second dielectric material layer disposed on the first dielectric layer. An intermediate material layer, such as an etch stop layer may be disposed between the first and second dielectric material layers.

A first resist layer 108 is coated on the material layer 104 and a second resist layer 112 is disposed on the first resist layer 108. The first and second resist layers 108 and 112 may be different in composition. For example, with different resist composition, the two resist layers have different sensitivities (exposure threshold). In one embodiment, other material layers, such as 106 and 110, may be formed between the resist layers and/or below the resist layers for one or more purpose, such as attenuation and/or isolation.

Referring to FIGS. 4 through 7, one way to describe the exposure of two resist layers 108 and 112 is to consider exposure intensities for the two resist layers.

Figure 4:
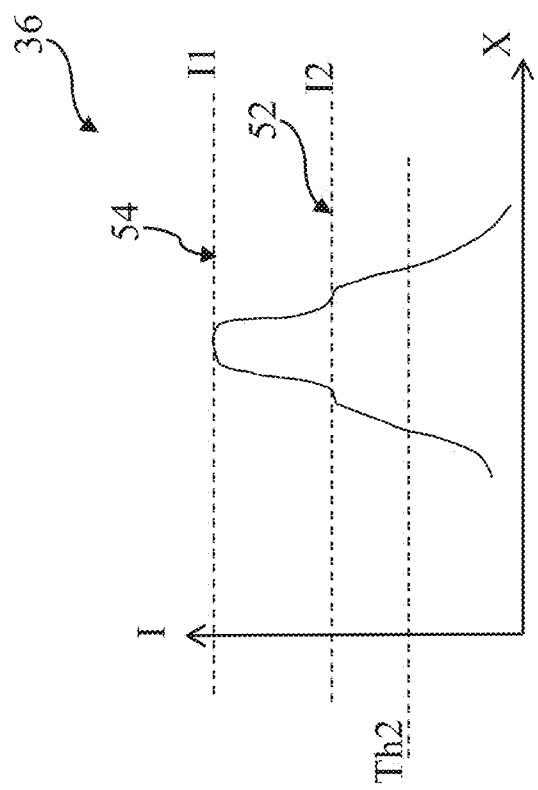

FIG. 4 illustrates an exposure intensity profile 36 of the second resist layer 112, which is the upper of the two resist layers in the present embodiment. Specifically, FIG. 4 graphically illustrates the exposure intensity distribution (vertical scale) across the width of the second resist layer 112 to be exposed (horizontal scale) corresponding to the transmittance profile along the dashed line A-A' of the mask 10, which is illustrated in FIG. 3.

Figure 5:
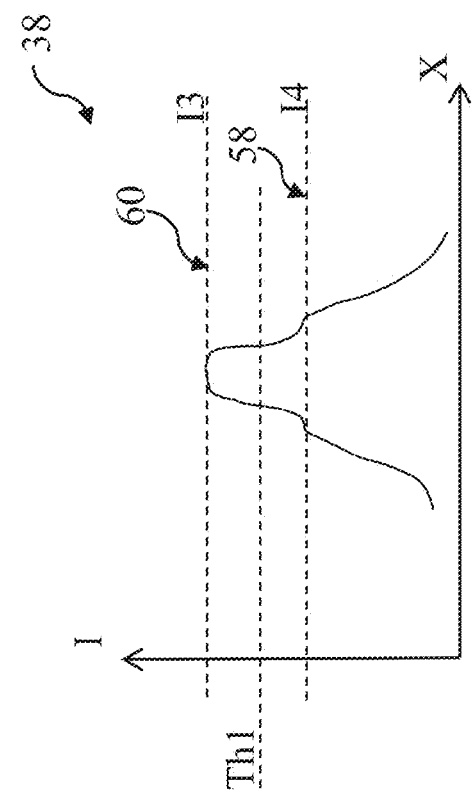
FIGS. 4 and 5 are diagrammatical views of various exposure intensity profiles during a lithography exposure process using the dosage map of FIG. 1, according to one or more embodiments of the present disclosure.

FIG. 5 illustrates an exposure intensity profile 38 of the first resist layer 108, which is the lower of the two resist layers in the present embodiment. Specifically, FIG. 5 graphically illustrates the exposure intensity distribution (vertical scale) across the width of the first resist layer 108 to be exposed (horizontal scale) corresponding to the transmittance profile along the dashed line A-A' in the mask 10. The exposure intensity profile 38 may be different from the exposure intensity profile 36 due to various factors, which include the attenuation and scattering of the exposure radiation from the second resist layer 112 and additionally from the material layer 110 (if present).

By a single lithography exposure process using the mask 10 with the IC pattern defined thereon, latent patterns 40 and 42 are formed on the first and second resist layers 108 and 112, respectively, as illustrated in FIGS. 7 and 6. The latent pattern of a resist layer refers to the exposed pattern on the resist layer, which eventually becomes a physical resist pattern, such as by a developing process. In the present case, the latent patterns illustrated in FIGS. 6 and 7 are corresponding images of the exposed portions with exposing intensity equal to or greater than the respective exposure threshold.

In the present embodiment, the latent pattern 40 on the first resist layer 108, as illustrated in FIG. 7, includes a first feature 48. The latent pattern 42 on the second resist layer 112, as illustrated in FIG. 6, includes a second feature 46. The latent pattern 42 on the second resist layer 112 and the latent pattern 40 on the first resist layer 108 are different from each other. Therefore, by one exposure process, two resist layers are exposed with respective patterns. This is further explained below.

Each resist material has its respective exposure threshold to radiation. When the exposing intensity is equal to or greater than the exposure threshold, the corresponding portion of the resist is chemically changed such that it will be developed (e.g., it is removed by the developer when the resist is positive tone) in a developing process. When the exposing intensity is less than the exposure threshold, the corresponding portion of the resist is not chemically changed to be developed (e.g., it remains during the developing process when the resist is positive tone). It is understood that the term "changed" means that the resist has sufficiently changed to respond differently, e.g., as exposed positive-tone resist responds in the development process. In one example where the resist is positive tone, only portions of the resist exposed with exposing intensity equal to or greater than the exposure threshold are removed by a suitable developer during the developing process. Other portions of the resist unexposed or exposed with exposing intensity less than the exposure threshold remain after the developing process.

In another example where the resist is negative tone, the portions of the resist unexposed or exposed with exposing intensity less than the exposure threshold are removed by a suitable developer during the developing process. Other portions of the resist exposed with exposing intensity equal to or greater than the exposure threshold remain after the developing process.

In the present embodiment, the first and second resist layers are both positive tone. During the lithography exposure process using the mask 10, both the first and second resist layers are exposed to form latent patterns 40 and 42 as illustrated in FIGS. 7 and 6, respectively, due to one or more factors.

In one embodiment, the first resist layer and the second resist layer are designed to have different exposure thresholds. The first resist layer 108 has a relatively high exposure threshold $T_h 1$ and the second resist layer 112 has a relatively low exposure threshold $T_h 2$, i.e., less than that of the first resist layer.

In FIG. 4, the exposure intensity profile 36 of the second resist layer 112 includes a portion corresponding to the second feature 20 and the first feature 18. Accordingly, the exposure intensity profile 36 includes a step shoulder 52 with an intensity $I_2$ associated with the second transmittance state (S2). The exposure intensity profile 36 further includes a peak 54 having an intensity $I_1$ associated with the first transmittance state (S1). The resist material of the second resist layer 112, the mask 10, and the exposure radiation intensity are designed such that the second threshold $T_h 2$ is less than the intensity $I_2$. Thus, the second feature 20 in the mask 10 is imaged to form the second feature 46 in the latent pattern 42 during the lithography exposure process, as illustrated in FIG. 6. The first feature 18 is also imaged to the latent pattern 42 but is overlapped with the second feature 46.

In FIG. 5, the exposure intensity profile 38 of the first resist layer 108 includes a portion corresponding to the first feature 18 and the second feature 20 of the mask 10. Accordingly, the exposure intensity profile 38 includes a step shoulder 58 having an intensity $I_4$ associated with the second transmittance state (S2). The exposure intensity profile 38 further includes a peak 60 having an intensity $I_3$ associated with the first transmittance state (S1). The intensities $I_3$ and $I_4$ may be less than the intensities $I_1$ and $I_2$, respectively, due to one or more attenuation mechanisms. The resist material of the first resist layer 108, the mask 10, and the exposure radiation intensity are designed such that the first threshold $T_h 1$ is less than the intensity $I_3$ but is greater than the intensity $I_4$. Thus, the second feature 20 of the mask 10 is not imaged in the latent pattern but the first feature 18 of the mask 10 is imaged to form the first latent feature 48 in the latent pattern 40 during the lithography exposure process, as illustrated in FIG. 7.

Since the first resist layer 108 has a higher exposure threshold $T_h1$, the first latent pattern 40 formed thereon by the lithography exposure process is different from that of the second resist layer 112. By one lithography exposure process using the mask 10, two different latent patterns 40 and 42 are respectively formed in the two resist layers 108 and 112.

By properly choosing dimensions of various features in the IC pattern, as defined on the mask 10, the first and second latent patterns are formed on the respective resist layer with respective features of proper dimensions (dimensions on wafer or DOW) in best focus (BF). In one example, the first feature 18 of the first layer pattern is tuned according to a first size bias to form the latent pattern 40 in the first resist layer 108 with proper dimensions. The second feature 20 of the second layer pattern is tuned with a second size bias different from the first size bias to form the corresponding latent pattern 42 in the second resist layer 112 with proper dimensions.

In one example illustrated in FIG. 1, the first feature 18 is designed with a first dimension Vx in the X direction relative to the corresponding dimension Lx of the second feature 20, where Vx is less than Lx.

For the lithography exposure process, the mask 10 is designed to have different biases to the features in the first layer pattern and the second layer pattern. The bias includes two or more freedoms, including size and transmittance, to tune the CDs of various features.

In another embodiment, an attenuation mechanism is provided such that the exposing intensity to the first resist layer is less than the exposing intensity to the second resist layer to form different latent patterns on respective resist layers. In this embodiment, the exposure threshold to the first resist layer 108 may be chosen as same as that of the second resist layer 112 or alternatively different. In one example, the second resist layer 112 attenuates the exposure radiation such that only a portion of the exposing beam reaches to the first resist layer. In another example illustrated in FIG. 8, the attenuating material layer 110 is inserted between the first and second resist layers. The attenuating material layer 110 absorbs the exposing radiation such that the exposing beam reaching the first resist layer 108 is only a portion of the exposing radiation projected on the second resist layer 112. Thus the exposing intensity to the first resist layer 108 is less than the exposing intensity to the second resist layer 112. Accordingly, based on the exposing intensity and the exposure threshold, the latent pattern on the first resist layer 108 is different from the latent pattern formed on the second resist layer 112. Particularly, when the first exposure threshold T1 associated with the first resist layer 108 is greater than I4 and less than I3 (as illustrated in FIG. 5), the second feature 20 defined in the mask 10 is not imaged to the first resist layer 108. The first feature 18 is imaged to the first resist layer 108 by the lithography exposure process, thereby forming the latent feature 40 as illustrated in FIG. 7. As a comparison, the second exposure threshold T2 associated with the second resist layer 112 is less than both I1 and I2 (as illustrated in FIG. 4), both the first feature 18 and the second feature 20 defined in the mask 10 are imaged to the second resist layer 112, thereby forming the latent feature 42 as illustrated in FIG. 6.

In various embodiments, by properly choosing transmittance of the mask 10; choosing the exposure threshold through tuning of the resist materials; choosing the exposing intensity through various attenuation mechanisms (resist or inserting an attenuating material layer); adjusting various dimensions of various features in the IC pattern, or a combination thereof, the different latent patterns are formed on respective resist layers with proper dimensions.

Thereafter, the two resist layers are developed to form a first resist pattern in the first resist layer and a second resist pattern in the second resist layer. Other manufacturing operations follow to transfer the two resist patterns to the substrate. In one example, one or more etch operations are implemented to transfer the two resist patterns to respective underlying material layers on the substrate.

By the disclosed method, two resist layers are simultaneously exposed to form respective patterns by one lithography exposure process. Therefore, both the manufacturing cost and manufacturing cycle time are reduced. Other benefits may present in various embodiments. In one embodiment, the two resist patterns, therefore, the two respective patterns transferred to the underlying material layers, are intrinsically aligned since they are printed from the same IC pattern.

FIGS. 8-20 are sectional views of the semiconductor structure 100 at various fabrication stages. The method to simultaneously pattern two resist layers using the mask 10 and the semiconductor structure made thereby are further described below according to one embodiment with reference to FIGS. 1-20.

Referring to FIG. 8, a semiconductor substrate 102 is provided. In the present embodiment, the semiconductor substrate 102 includes silicon. Alternatively, the substrate 102 includes germanium, silicon germanium or other suitable semiconductor material, such as diamond, silicon carbide or gallium arsenic. The substrate 102 may further include additional features and/or material layers, such as various isolation features formed in the substrate. The substrate 102 may include various p-type doped regions and/or n-type doped regions configured and coupled to form various devices and functional features. All doping features may be achieved using a suitable process, such as ion implantation in various steps and techniques. The substrate 102 may include other features, such as shallow trench isolation (STI) features. The substrate 102 may also include a portion of an interconnect structure that includes metal lines in various metal layers, via features to provide vertical connection between the metal lines in the adjacent metal layers, and contact features to provide vertical connection between the metal lines in the first metal layer and various device features (such as gates, sources and drains) on the substrate.

Still referring to FIG. 8, various material layers are formed on the substrate 102. In the present embodiment, a dielectric material layer 104 is formed on the substrate 102. The dielectric material layer 104 may include plurality of dielectric films. In the present embodiment, the dielectric material layer 104 includes a first interlayer dielectric (ILD) material 104A formed on the substrate 102. The first ILD material layer 104A includes a dielectric material, such as silicon oxide, low k dielectric material, other suitable dielectric material or combination thereof.

The dielectric material layer 104 includes a second ILD material layer 104B formed over the first ILD material layer 104A. The second ILD material layer 104B is similar to the first ILD material layer 104A in terms of composition and formation. For example, the second ILD material layer 104B includes a dielectric material, such as silicon oxide, low k dielectric material, other suitable dielectric material or combination thereof.

The dielectric material layer 104 includes an etch stop layer 104C formed between the first and second ILD material layers. The etch stop layer 104C has an etch selectivity to the ILD material and functions to stop etch during subsequent operation to pattern the ILD material layers. The etch stop layer 104C is different from the ILD material in composition and includes another dielectric material, such as silicon nitride, silicon oxynitride or silicon carbide. Various dielectric materials may be deposited by a suitable technique, such as chemical vapor deposition (CVD), spin-on coating or other suitable method.

Two resist layers are subsequently formed on the dielectric material layer 104. Specifically, a first resist layer 108 is formed over the dielectric material layer 104. The first resist layer 108 is formed by spin-on coating or other suitable technique. A second resist layer 112 is formed over the first resist layer 108. The second resist layer 112 is formed by spin-on coating or other suitable technique. Other steps, such as baking, may follow the coating of each resist layer. The first and second resist layers may have similar or different compositions from each other, according to various embodiments. Two resist layers include a same resist material or different resist materials sensitive to exposure radiation.

In one embodiment, the second resist layer 112 is different from the first resist layer 108 and is formed directly on the first resist layer 108. The first and second resist layers are configured to be exclusively dissolved in separate, respective developers. Specifically, a first developer is used to develop the first resist layer 108 and a second developer is used to develop the second resist layer 112. The first developer is different from the second developer. The first resist layer is dissoluble in the first developer but indissoluble in the second developer. The second resist layer is dissoluble in the second developer but indissoluble in the first developer. In another embodiment, although the two resists are mutually indissoluble, they could dissolve in the same developer. In one example, the first and second resist layers are chosen to have different exposure thresholds. In another example, the second resist layer 112 attenuates the exposing radiation during the lithography exposure process such that the exposing radiation projected on the second resist layer 112 is partially absorbed and only a portion of the exposing radiation reaches the first resist layer 108. Thus the exposing intensities to the first and second resist layers are different. Specifically, the exposing intensity to the first resist layer 108 is less than the exposing intensity to the second resist layer 112. In this case, the exposure thresholds of the first and second resist layers may be chosen to be the same, or different. In another example, the first resist layer 108 has a thickness ranging between about 20 nm and about 60 nm. In another example, the second resist layer 112 has a thickness ranging between about 20 nm and about 40 nm.

In another embodiment, a material layer 110 is formed between the first and second resist layers. In this embodiment, the two resist layers may be same in composition or different. The material layer 110 is inserted there-between to serve one or more functions. In one example, the material layer 110 separates the first and second resist layers from each other if those two resist layers are mutually dissoluble. In another example, the material layer 110 functions to absorb the exposing radiation such that the exposing radiation projected on the second resist layer 112 is partially absorbed and only a portion of the exposing radiation reaches the first resist layer 108. Thus the exposing intensity to the first resist layer 108 is less than the exposing intensity to the second resist layer 112. In another example, the material layer 110 functions as a hard mask during subsequent operations to pattern the dielectric material layer 104. The material layer 110 is formed on the first resist layer 108 before the coating of the second resist layer 112.

The material layer 110 includes a dielectric material, such as aluminum oxide ($Al_2O_3$), silicon oxide ($SiO_2$), silicon nitride (SiN), titanium oxide (TiO), or other suitable material. The material layer 110 is formed by spin-on coating or low temperature deposition without damage to the underlying resist layer 108. For example, the material layer 110 of aluminum oxide is deposited by spin-on coating. In another example, the material layer 110 of silicon oxide, silicon nitride, or titanium oxide, is formed by a low temperature deposition, such as CVD at low temperature. In one example, the material layer 110 has a thickness ranging between about 10 nm and about 20 nm.

In another embodiment, a second material layer 106 is formed between the dielectric material layer 104 and the first resist layer 108. In the present embodiment, the second material layer 106 functions as a hard mask layer during the subsequent operations to pattern the dielectric material layer 104. The material layer 106 may be different from the material layer 110 or alternatively same. For example, the material layer 106 may include aluminum oxide. The second material layer 106 is formed on the dielectric material layer 104 before the coating of the first resist layer 108. The second material layer 106 may include one or more films to enhance the operations of patterning the dielectric material layer 104.

Figure 9:
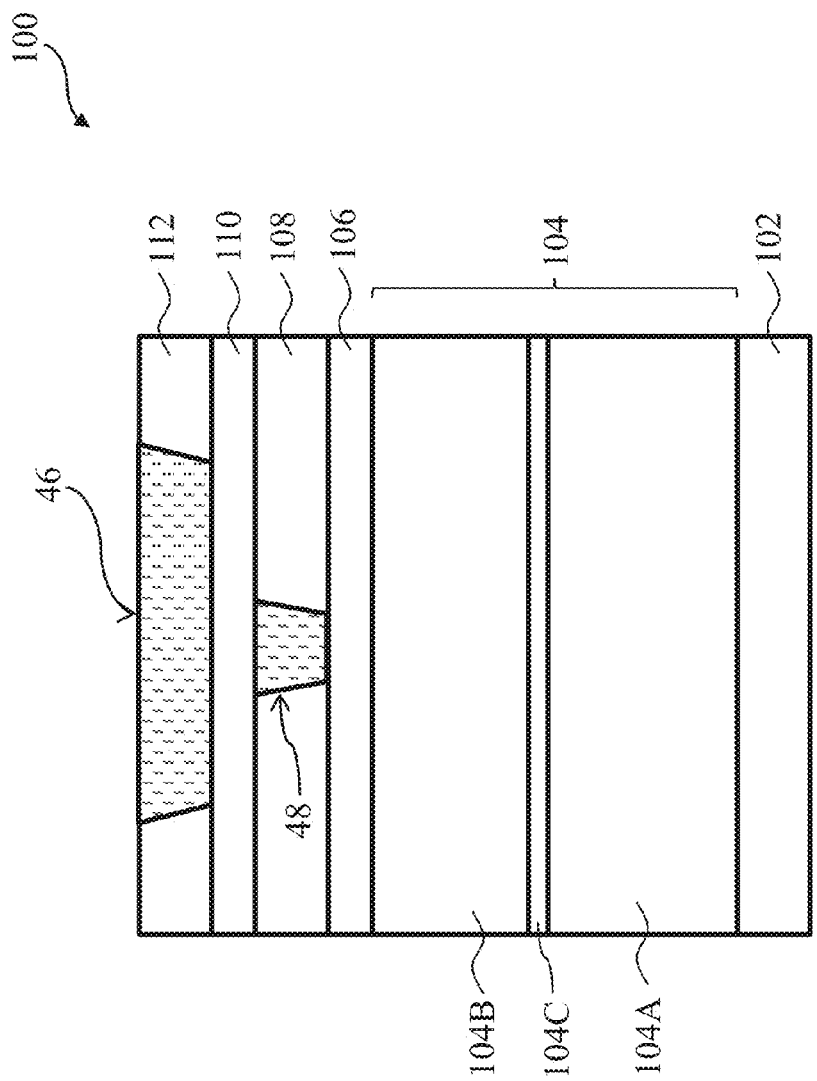

Referring to FIG. 9, a lithography exposure process is implemented using the mask 10 to simultaneously expose both the first and second resist layers, thereby forming latent patterns on respective resist layers. During the lithography exposure process, the IC pattern defined in the mask 10 is imaged to the second resist layer 112 and the first resist layer 108. A first latent pattern 40 is formed in the first resist layer 108 and a second latent pattern 42 is formed in the second resist layer 112. A latent pattern is referred to as a portion of the resist layer that is exposed but not developed yet. The first and second latent patterns are different from each other due to different exposing intensities, different exposure thresholds or both, as described above with reference to FIGS. 1 through 7. However, the first and second latent patterns are related since both are images of the same IC pattern defined on the mask 10. In the present example, the first latent pattern 40 includes a first latent feature 48 associated with the via feature 18 and the second latent pattern 42 includes a second latent feature 46 associated with the line feature 20 defined in the mask 10. Other operations, such as post-exposure-baking (PEB), may follow the lithography exposure process.

Figure 10:
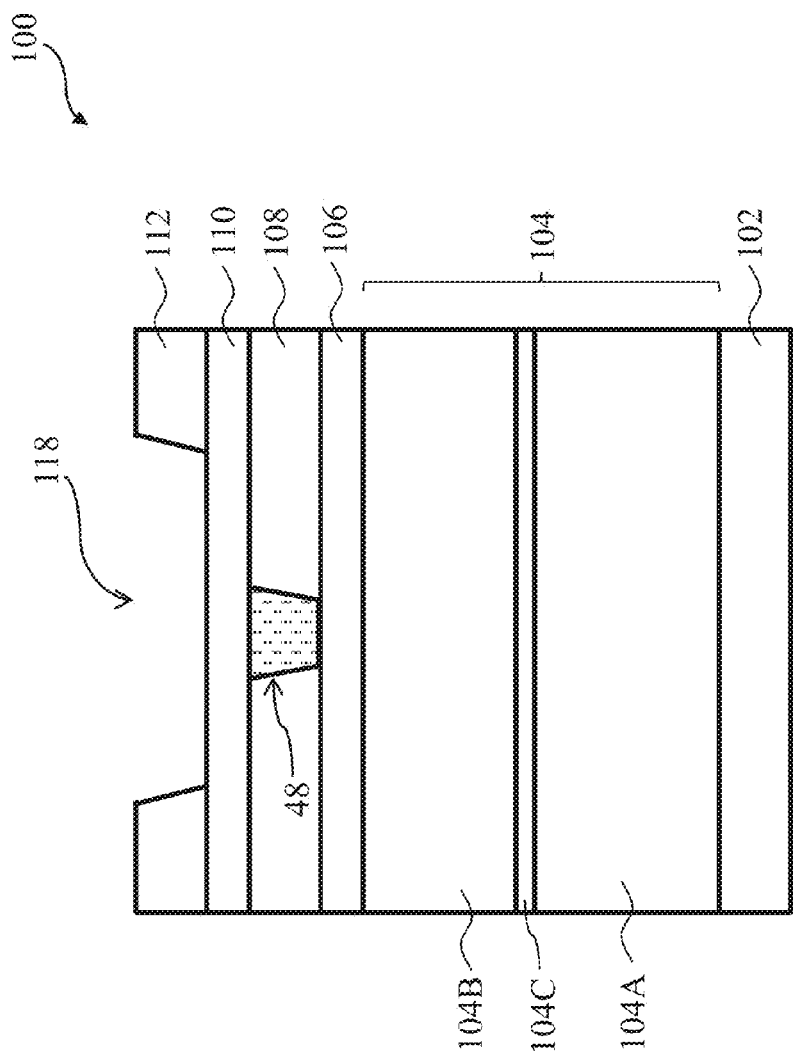

Referring to FIG. 10, the second resist layer 112 is developed by the corresponding developer. In the present embodiment, both the first and second resist layers are positive tone. The exposed portion (the latent feature 46) of the second resist layer 112 is removed in the developer, thereby forming a patterned second resist layer having an opening 118 associated with the second latent feature 46. Other operations, such as hard baking, may follow the developing process.

Figure 11:
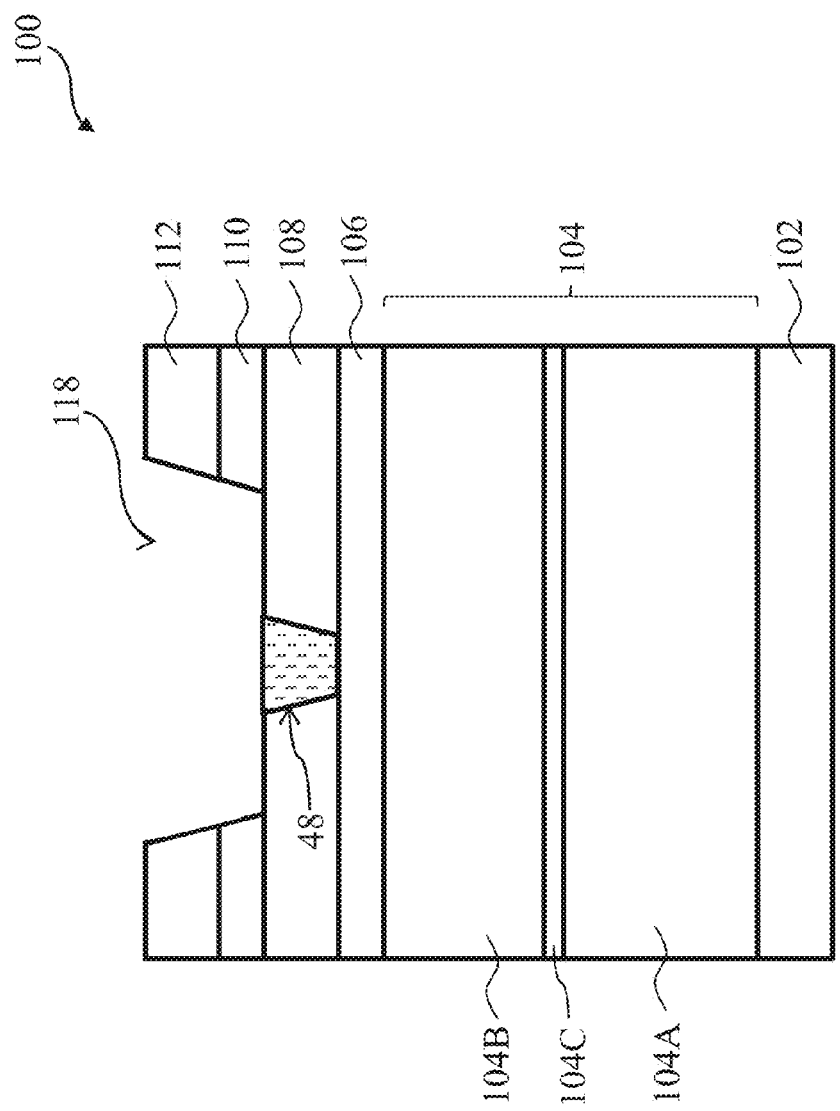

Referring to FIG. 11, an etch process is applied to selectively etch the material layer 110 and remove the portion of the material layer 110 aligned within the opening 118. The etch process and the etchant are properly chosen for selective etch without damage to the resist.

Figure 12:
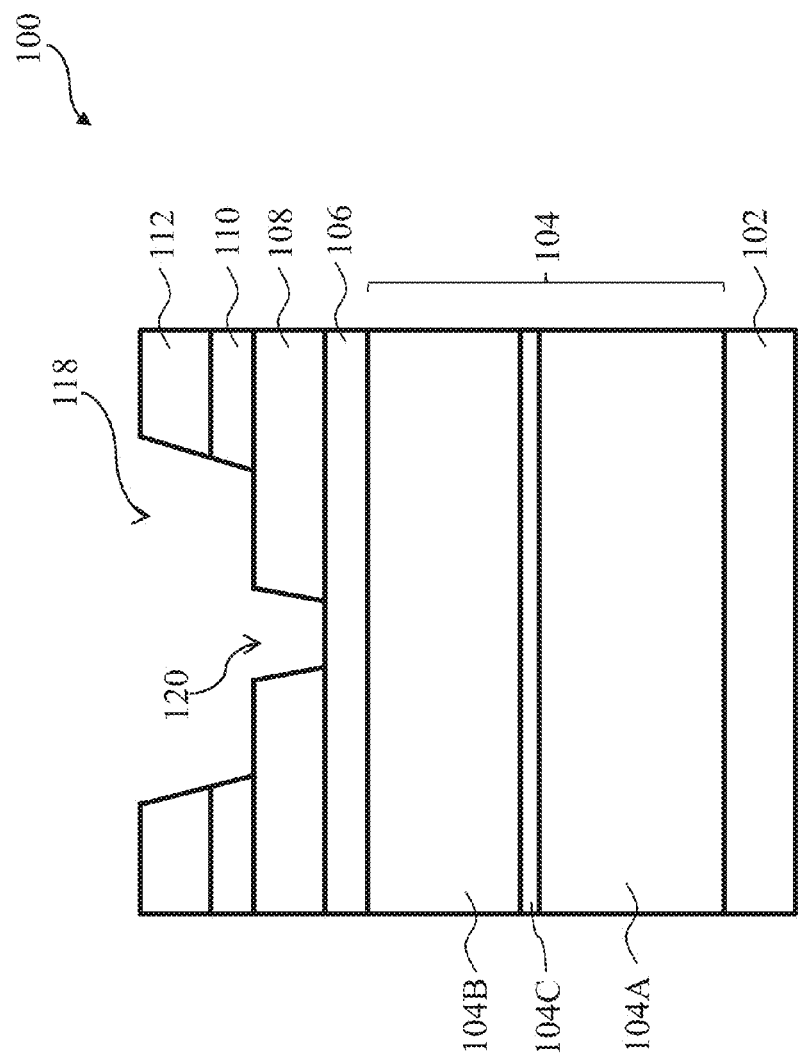

Referring to FIG. 12, the first resist layer 108 is developed by the corresponding developer. In the present embodiment, the first resist layer is positive tone. The exposed portion (the first latent feature 48) is removed in the developer, thereby forming a patterned first resist layer having an opening 120 associated with the first latent feature 48. Other operations, such as hard baking, may follow the developing process.

Figure 13:
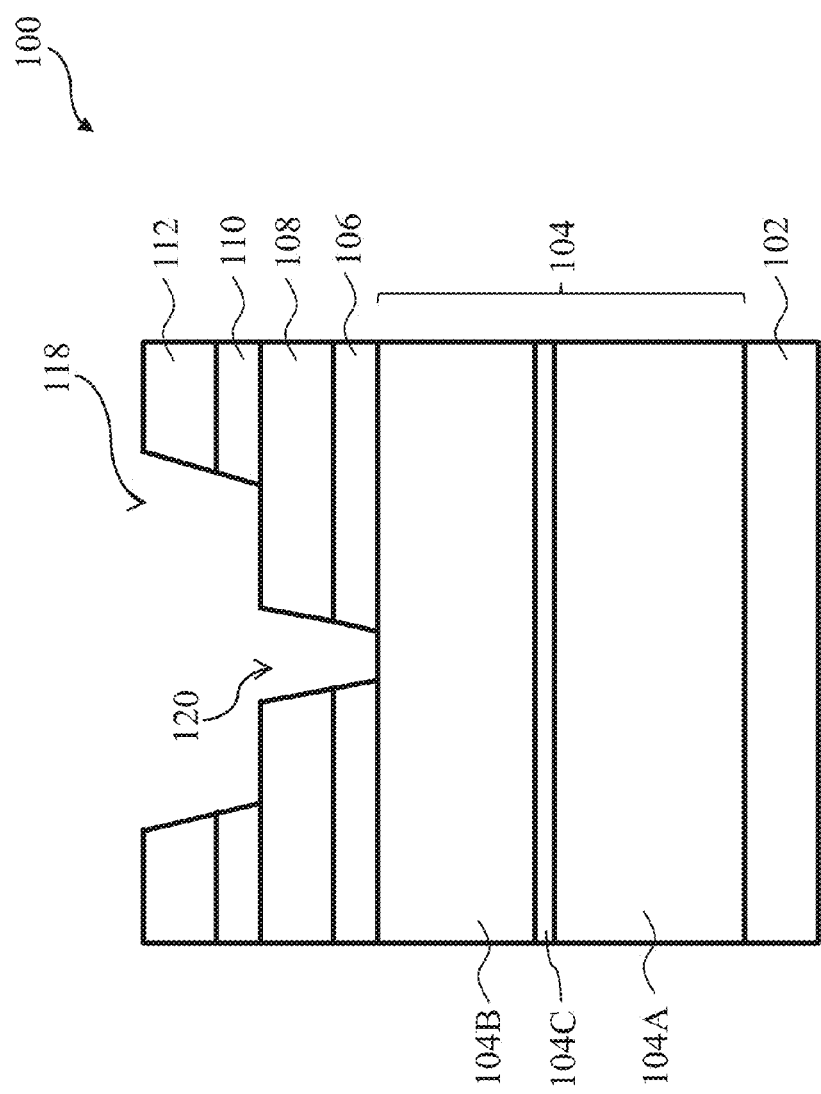

Referring to FIG. 13, another etch process is applied to selectively etch the second material layer 106 to remove the portion within the opening 120.

Figure 14:
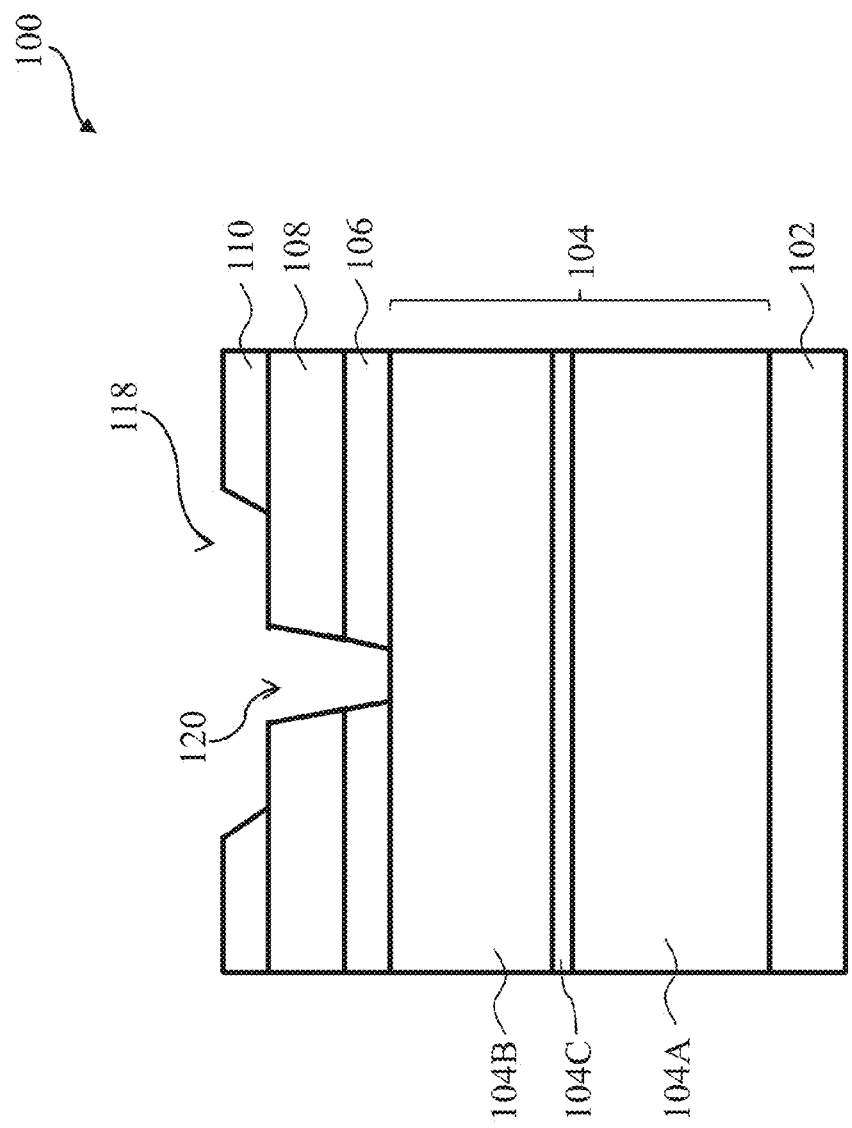

Referring to FIG. 14, the second resist layer 112 may be removed by a suitable process, such as wet stripping or plasma ashing.

Other operations are applied to transfer the openings 118 and 120 to the respective material layers. One embodiment is further described below.

Figure 15:
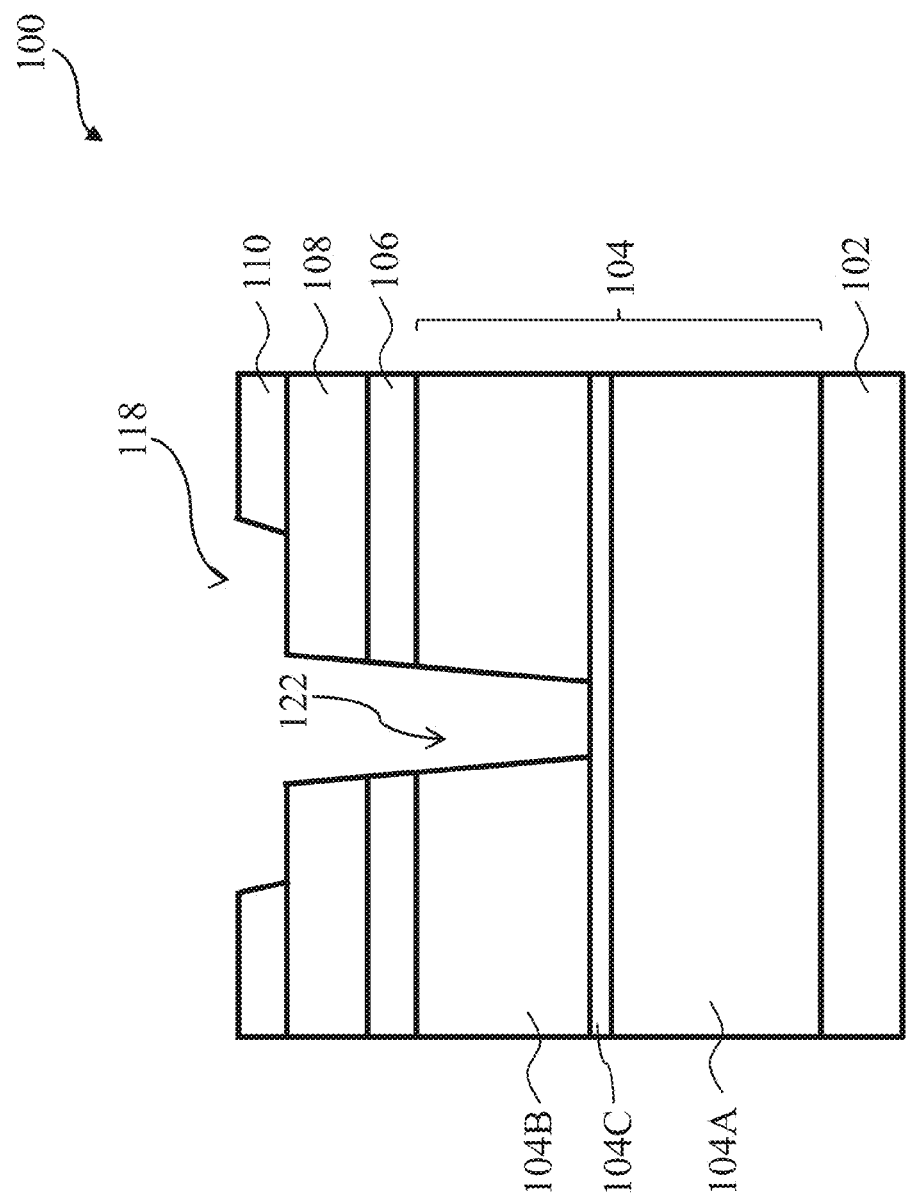

Referring to FIG. 15, an etch process is applied to selectively etch the second ILD material layer 104B within the opening 120, thereby forming a trench 122 in the second ILD material layer 104B. The etch process stops on the etch stop layer 104C. The etch process is properly chosen to form the trench 122. For example, dry etch, wet etch, or a combination thereof, may be applied for transferring the opening 120 to the second ILD material layer 104B, forming the trench 122.

Figure 16:
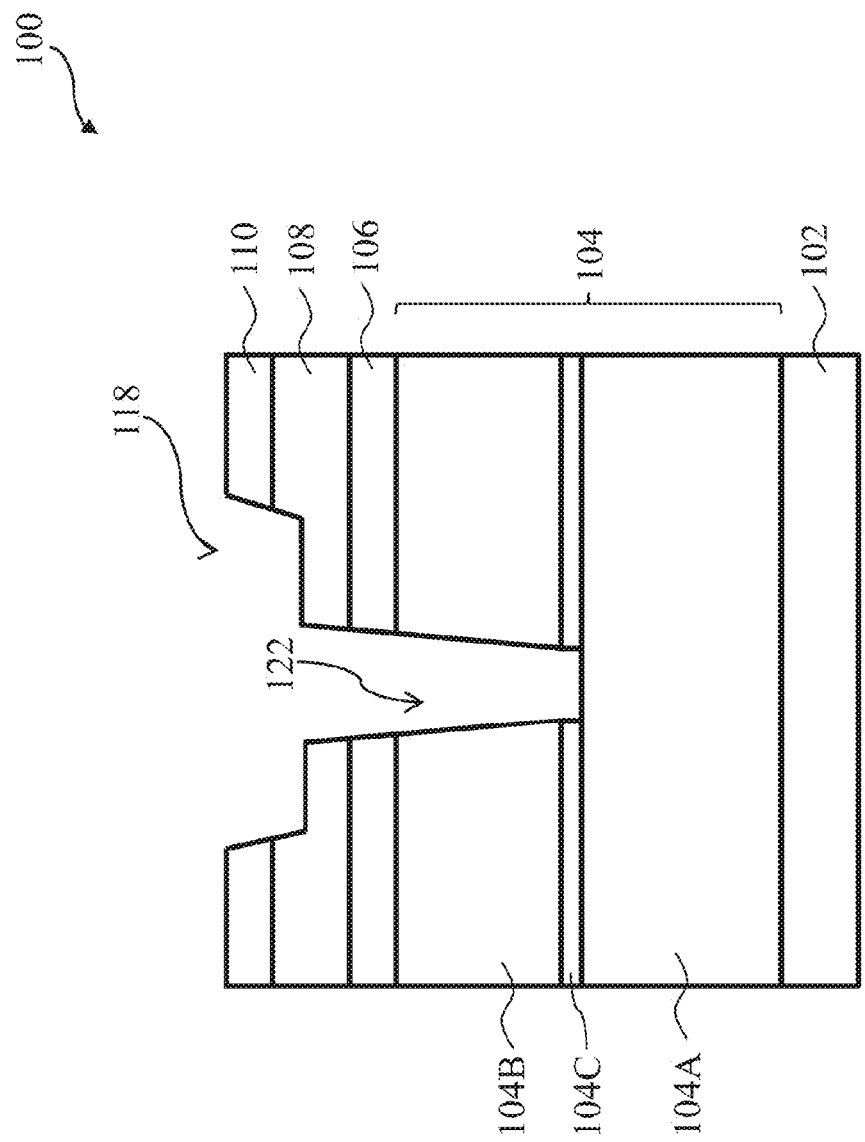

Referring to FIG. 16, another etch process is applied to selectively etch the etch stop layer 104C within the trench 122, using a suitable etch technique and etchant. In one embodiment, a wet etch may be applied to open the etch stop layer 104C. For example where the etch stop layer 104C includes silicon oxide, a hydrofluoride (HF) may be used as etchant to etch the etch stop layer 104C.

Figure 17:
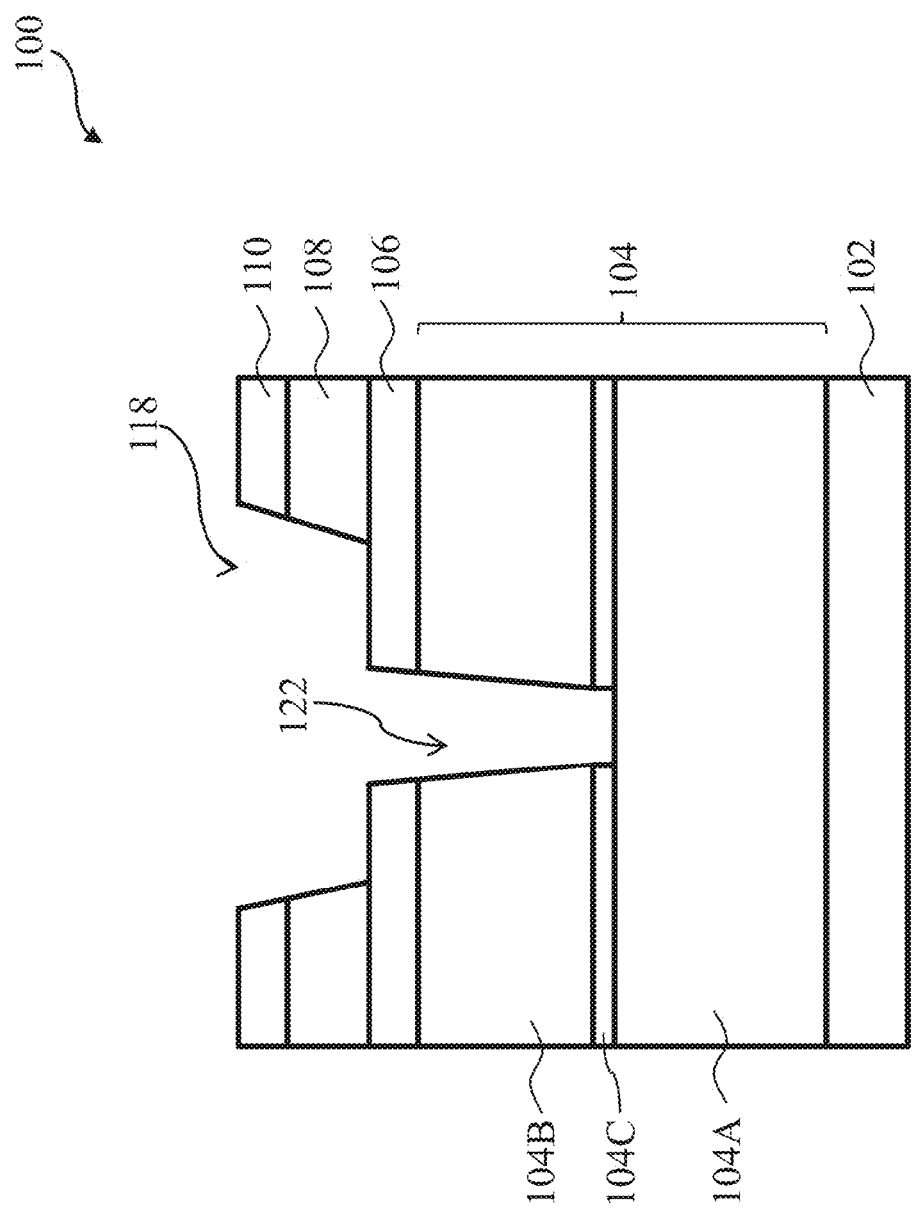

Referring to FIG. 17, a trimming process is applied to trim the first resist layer 108, thereby transferring the opening 118 from the material layer 110 to the first resist layer 108. The uncovered portion of the first resist layer 108 is removed by the trimming process. In one embodiment, the trimming process is similar to a resist strip process. For example, the trimming process implements wet stripping.

Figure 18:
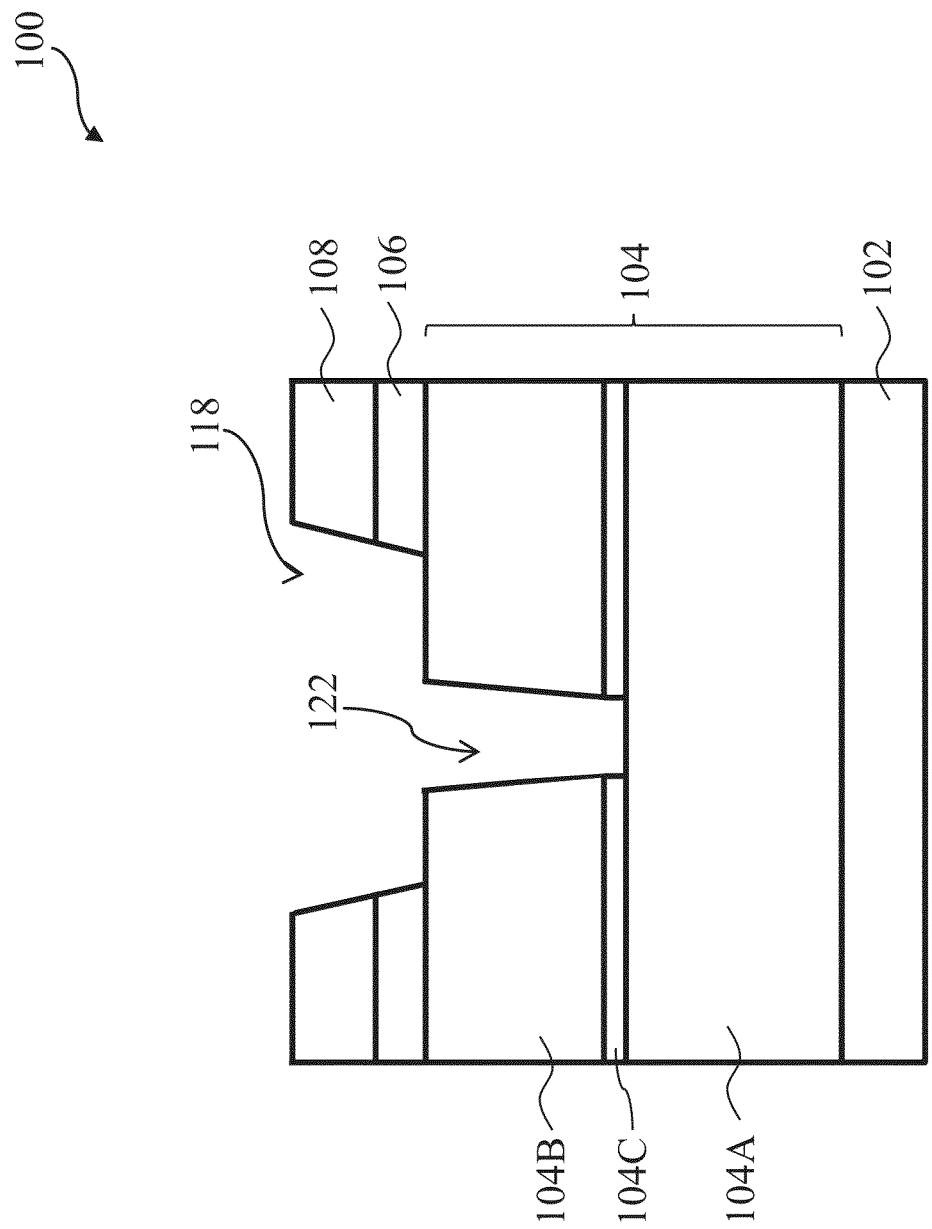

Referring to FIG. 18, an etch process is applied to etch the material layer 106 within the opening 118, thereby transferring the opening 118 to the material layer 106. In one embodiment, the material layer 106 and the material layer 110 includes a same material (such as aluminum oxide), the etch process opens the material layer 106 and removes the material layer 110 as well.

Figure 19:
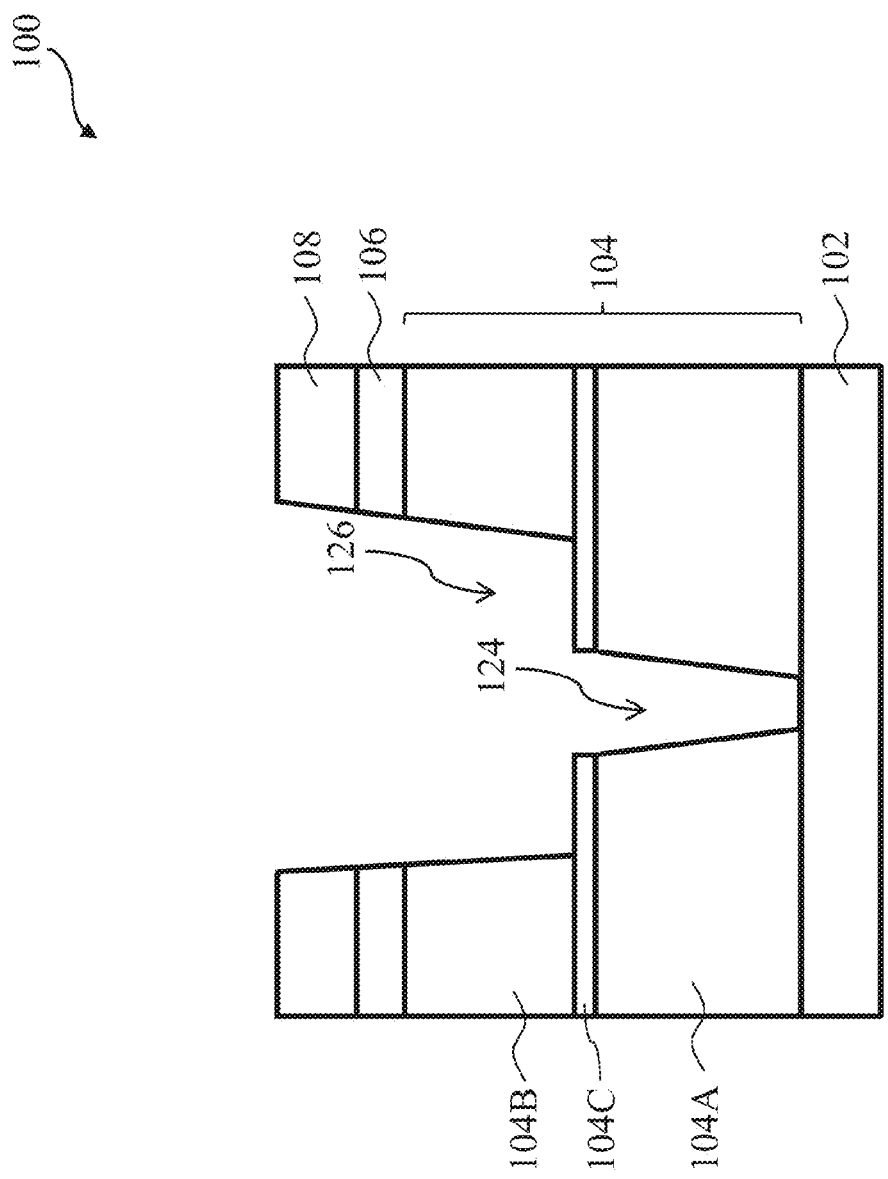

Referring to FIG. 19, another etch process is applied to selectively etch both the first ILD material layer 104A and the second ILD material layer 104B using the material layer 106 as an etch mask, thereby forming a first trench 124 for the via feature in the first ILD material layer 104A and a second trench 126 for the metal line in the second ILD material layer 104B. In the present embodiment, the first and second ILD material layers include a same dielectric material. The etch process recesses both the first and second ILD material layers. The etch process is properly chosen for selective etch. For example, dry etch may be applied to form the via trench 124 and metal line trench 126 in respective ILD material layers.

In some embodiments, another etch stop layer is disposed between the substrate 102 and the first ILD material layer 104A such that the etch process properly stops on the etch stop layer. In this case, the etch stop layer can be subsequently opened by another etch for proper electrical connection. In another embodiment, an underlying metal layer is formed below the first ILD material layer and the via trench 126 is properly aligned with the underlying metal line for electrical connection. Other operations may be subsequently implemented. For example, the first resist layer 108 may be removed by wet stripping or plasma ashing.

Although the procedure to form the via trench 124 and metal line trench 126 is provided above according to one or more embodiments, other procedure may be alternatively applicable to form the via trench 124 and the metal line trench 126 using the patterned first and second resist layers.

In another embodiment where the material layer 110 is not present, various etch operations applied to the material layer 110 are eliminated.

Figure 20:
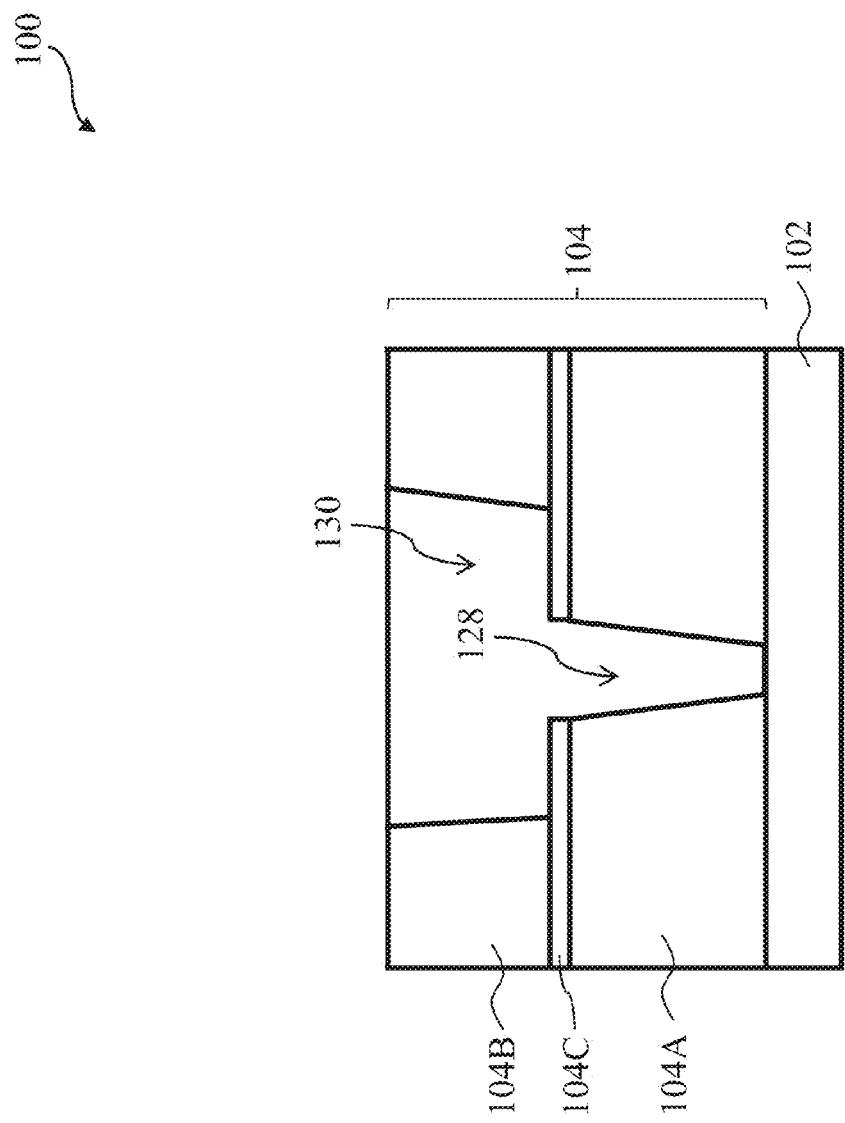

Referring to FIG. 20, via feature 128 and metal line 130 are formed by a suitable procedure. In one embodiment, a conductive material, such as metal or metal alloy, is filled in the via trench 124 and the metal line trench 126 (FIG. 19) by deposition, such as physical vapor deposition (PVD), plating or a combination thereof. A chemical mechanical polishing (CMP) process is applied to remove excessive conductive material and to planarize the top surface.

In another embodiment, the material layer 106 may serve as a polishing stop layer and may be removed after the CMP process by an etch process. In a particular example, copper is used as the conductive material. In furtherance of this example, a copper seed layer is formed by PVD. Thereafter, bulk copper is filled in the trenches 124 and 126 by plating. A CMP process is subsequently applied to remove the excessive copper and planarize the top surface. In yet another embodiment, a lining material, such as titanium nitride, is formed on the sidewalls of the via trench 124 and the metal line trench 126 before filling in the trenches with the conductive material. The lining layer is deposited by a proper technique, such as PVD or CVD. The lining layer may function as a diffusion barrier and adhesive layer for integrity of the interconnect structure.

Although not shown, other processing operation may be presented to form various doped regions such as source and drain regions and/or devices features such as gate electrode. In one example, the substrate may alternatively include other material layer to be patterned by the disclosed method, such as another patterned metal layer. In another example, additional patterning steps may be applied to the substrate to form a gate stack. In another example, the source and drain features are of either an n-type dopant or a p-type dopant are formed by a conventional doping process such as ion implantation.

Figure 21:
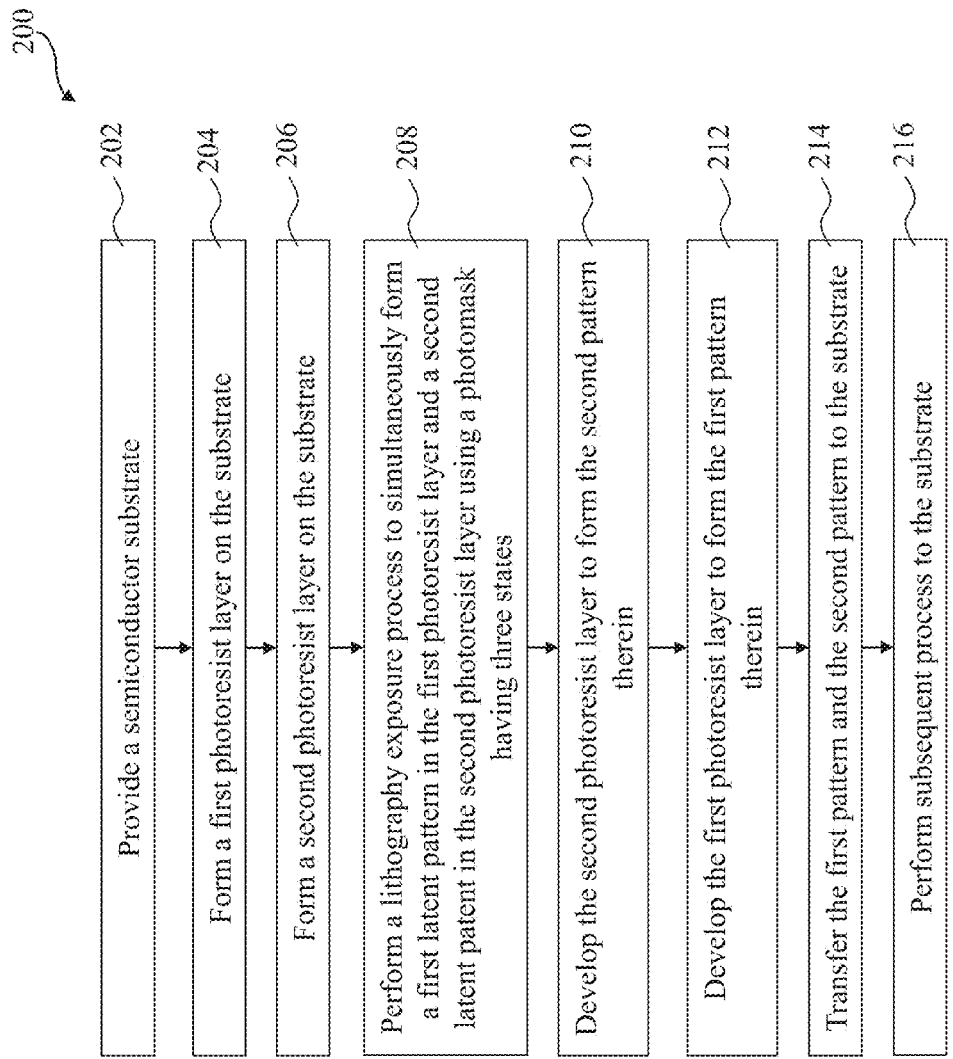
FIG. 21 is a flowchart of a method making a semiconductor structure constructed according to one or more embodiments of the present disclosure.

FIG. 21 is a flowchart of a method 200 of exposing two resist layers with respective latent patterns by single lithography exposure process, constructed according various aspects in one or more embodiments. The method 200 starts at 202 with a substrate, such as a semiconductor wafer. The substrate may further include one or more material layers, such as one or more patterned layers and one or more layers to be patterned.

At operation 204, a first resist layer is formed on the substrate. Forming of the first resist layer includes coating the first resist layer on the substrate by a suitable technique, such as spin-on coating. Other manufacturing steps, such as baking, may further be applied to the first resist layer.

At operation 206, a second resist layer is formed on the first resist layer. Forming of the second resist layer includes coating the second resist layer on the substrate by a suitable technique, such as spin-on coating. Other manufacturing steps, such as baking, may further be applied to the second resist layer.

The first and second resist layers may be the same or different in composition. In one embodiment, the second resist layer is different from the first resist layer in the exposure threshold. In another embodiment, the second resist layer is different from the first resist layer as they are mutually indissoluble. In another embodiment, a material layer is inserted between the first and second resist layer for separation, attenuation and/or etch mask.

The method 200 proceeds to operation 208 by performing a lithography exposure process using the mask 10 having three states to simultaneously expose both the first and second resist layers, thereby forming a first latent pattern in the first resist layer and a second latent pattern in the second resist layer. The first and second patterns are different from each other and define respective patterns to be transformed in different material layers.

The lithography exposure process exposes the two resist layers according using the mask 10 having three states. The three states S1, S2 and S3 are constructed to define various features from two layer patterns. Especially, the IC pattern defined in the mask 10 includes a first plurality of features for a first layer pattern and a second plurality of features for a second layer pattern. The first plurality of features is defined in the first state S1 and the second plurality of features is defined in the second S2 in the mask 10.

In the mask 10, the transmittances of various states and dimensions of the first layer patent and second layer pattern are designed according to exposure thresholds, and attenuation to the exposing intensity such that the features in the first layer pattern and the features in the second layer patter are imaged to the first and second resist layers, respectively, to form respective latent patterns with proper dimensions. Other steps may be implemented. In one embodiment, a post exposure baking process may be applied to the first and second resist layers after the lithography exposure process.

The method 200 proceeds to operation 210 by developing the second resist layer to form the patterned second resist layer. The second resist layer with the second latent pattern is converted to the patterned second resist layer with various openings thereby. In one embodiment, the second resist layer is positive tone, and the portions of the second resist layer associated with the second latent pattern are removed by the corresponding developer, resulting in the openings in the second resist layer (the second resist layer with the second pattern converted from the second latent pattern).

The method 200 proceeds to operation 212 by developing the first resist layer to form the patterned first resist layer. The first resist layer with the first latent pattern is converted to the patterned first resist layer with various openings. In one embodiment, the first resist layer is positive tone, and the portions of the first resist layer associated with the first latent pattern are removed by the corresponding developer, resulting in the openings in the first resist layer. Thereafter, other steps may be implemented. In one embodiment, one or more baking processes may be applied to the first and second resist layers collectively or separately.

The method 200 proceeds to operation 214 by transferring the first pattern and the second pattern to the substrate or underlying material layers on the substrate. The operation 214 may include one or more etch processes, such as those various embodiments associated with FIGS. 8 through 20. In one embodiment, a via trench and a metal line trench are formed in respective ILD material layers. Other manufacturing operations may be implemented before, during or after the method 200. In one embodiment, a procedure including metal deposition and CMP is implemented thereafter to form a via feature (or contact feature) and a metal line overlapped and aligned.

Figure 22:
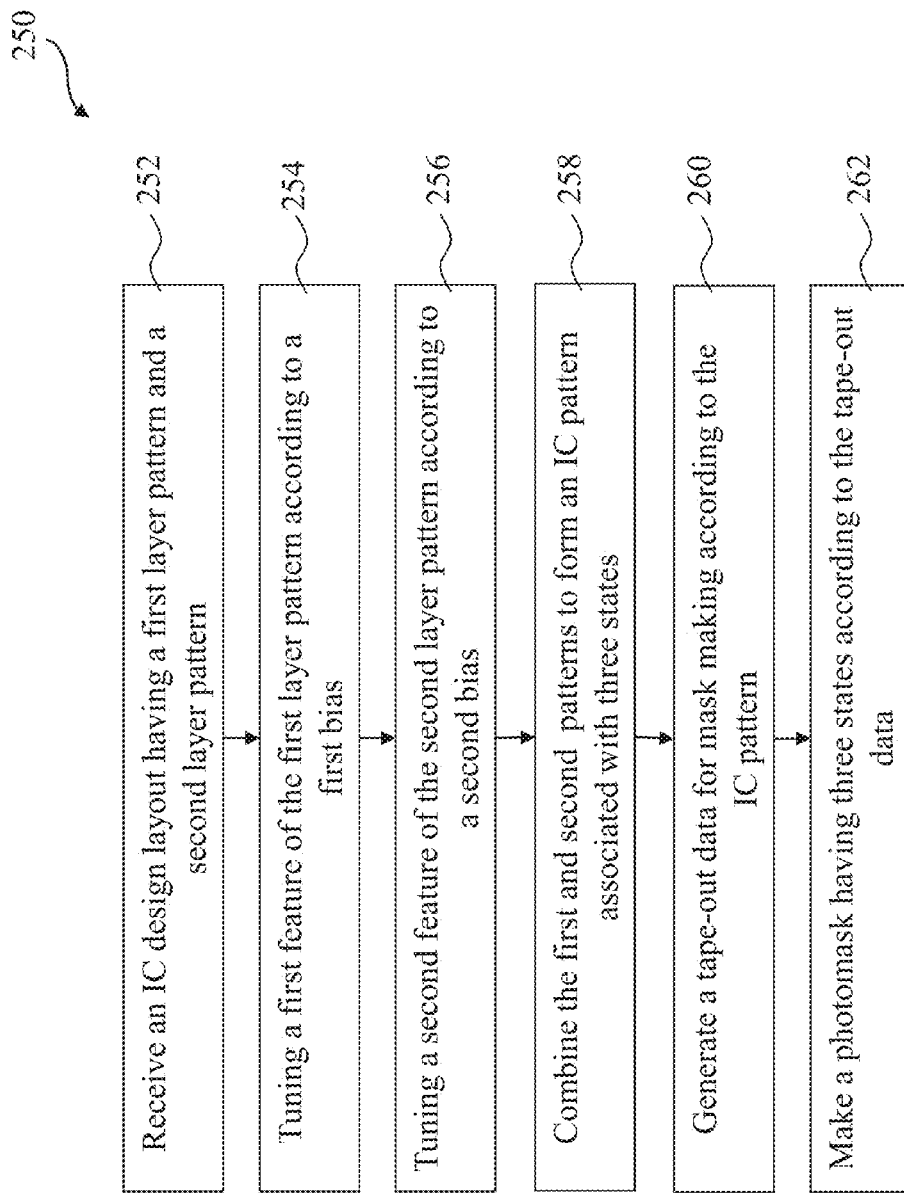
FIG. 22 is a flowchart of a method to generate an IC pattern and make a photomask based on the IC pattern.

The present disclosure also provides a method for generating a tape-out data for mask fabrication, such as the mask 10. FIG. 22 is a flowchart of a method 250 of generating the tape-out data that defines an IC pattern thereon and is used to fabricate a mask (the mask 10 in FIG. 1 in the present embodiment) having three states.

The method 250 begins at operation 252 by receiving an IC design layout that includes a first layer pattern and a second layer pattern. The first layer pattern is designed to expose a first resist layer by a lithography exposure process and furthermore, to be formed in a first material layer on a substrate (such as a semiconductor wafer) and the second layer pattern is designed to expose a second resist layer by the lithography exposure process and furthermore, to be formed in a second material layer overlying the first material layer. In one embodiment for illustration, the first layer pattern includes a via pattern having a via feature (or a plurality of via features), and the second layer pattern is a metal line pattern having one metal line (or a plurality of metal lines).

The method 250 proceeds to operation 254 by tuning a first feature of the first layer pattern according to a first bias. The first bias is chosen such that the first resist layer is exposed to form a first latent pattern having the first feature (a via feature in the present example) with proper dimensions. The first bias may include first intensity bias (through tuning the first transmittance) and first size bias (through tuning the dimension of the first feature). The tuning of the first feature includes adjusting the first transmittance S1 in the first state of the mask 10 (S1 is associated with the first feature since it is used to define the first feature in the mask 10) and adjusting the dimensions of the first feature. The transmittance and dimensions of the first feature collectively determine the critical dimensions of the first feature when formed on a semiconductor wafer during the lithography exposure process. When the first layer pattern includes more features, each is tuned in the same way until all features in the first layer pattern is exhausted.

The method 250 proceeds to operation 256 by tuning a second feature of the second layer pattern according to a second bias. The second bias is chosen such that the second resist layer is exposed to form a second latent pattern having the second feature (a metal line feature in the present example) with proper dimensions. The second bias may include second intensity bias (through tuning the second transmittance) and second size bias (through tuning the dimension of the second feature). The tuning of the second feature includes adjusting the second transmittance S2 in the second state of the mask 10 (S2 is associated with the second feature since it is used to define the second feature in the mask 10) and adjusting the dimensions of the second feature. The transmittance and dimensions of the second feature collectively determine the critical dimensions of the second feature when formed on the semiconductor wafer during the lithography exposure process. When the second layer pattern includes more features, each is tuned in the same way until all features in the second layer pattern is exhausted.

The first and second biases are different from each other in order to differentiate exposure intensities and form different latent patterns on the two resist layers.

In one embodiment, the mask material layers for the mask 10 are determined (such as MoSi and Cr) according to various factors, the tunings of the first feature and the second feature include adjusting the thicknesses of the mask material layers and the dimensions of the first and second features, respectively. In another embodiment, the mask material layers for the mask 10 are determined (such as MoSi and Cr) with respective composition and thickness, the tunings of the first feature and the second feature include adjusting the dimensions of the first and second features, respectively.

By different biases for the first layer pattern and the second layer pattern, the exposure radiation intensity difference between the first and second layer patterns is achieved. As an example illustrated in FIG. 5, the intensity 13 associated with the first layer pattern is different from (Specifically, greater than) the intensity 14 associated with the second layer pattern due to different biases. With this intensity difference, the first layer pattern can be selectively imaged to the first resist layer while the second layer pattern is not imaged to the first resist layer (such as by choosing different exposure thresholds and/or attenuation) during the lithography exposure process.

The method 250 proceeds to operation 258 by combining the first and second adjusted (with different transmittance and possibly further with dimensions adjustment) layer patterns to form a combined IC pattern. The combined IC pattern is a sum of the first and second adjusted layer patterns associated with respective transmittances. As illustrated in FIG. 1, the first adjusted layer pattern includes the first feature (the via feature) 18 with first transmittance S1 and possibly with the first size bias. The second adjusted pattern includes the metal line 20 with the second transmittance S2. The first and second adjusted patterns are combined according to the spatial relationship when formed on the substrate (the spatial relationship between the via pattern and metal line pattern). In the embodiment illustrated in FIG. 1, the via feature 18 and the metal line 20 are aligned and overlapped when formed in the substrate in the top view. In the present example, the via feature 18 has a dimension Vx and the metal line 20 has a dimension Lx greater than Vx in the combined IC pattern since the first bias and the second bias are different.

The method 250 proceeds to operation 260 by generating a tape-out data for mask fabrication according to the combined IC pattern. The tape-put data is constructed in a proper format that defines various features and various states associated with the respective features. Particularly, the combined IC pattern defined in the tape-out data includes three states and defines various features with respective state. Particularly, the first layer pattern is defined with the first state S1, the second layer pattern is defined with the second state S2 and the field is defined with the state S3. In furtherance of the present embodiment, the first feature 18 in the first layer pattern is defined in the first state S1, the second feature 20 in the second layer pattern is defined in the second state S2, and the field is defined in the third state S3. The tape-out data is defined in a proper data format, such as in GDS format.

The method 250 may proceed to operation 262 by making a mask (the mask 10 in the present example) according to the tape-out data that defines the combined IC pattern with different states. The method of making the mask 10 according to the tape-out data is described above in FIGS. 1 and 2. The first mask material layer 14 and the second mask material layer 16 are deposited on the mask substrate 12 and patterned according to the first layer pattern and the second layer pattern defined in the tape-out data, respectively.

In the present embodiment, the mask 10 is formed by the method disclosed in the patent application (client number 2013-0782/20461.2605) incorporated hereby. In this method, two resist layers are coated on the mask material layers and are exposed by a single exposure process using e-beam. Particularly, the IC pattern defined in the tape-out data is used as a dosage map for the e-beam lithography exposure process to pattern the two resist layers. The various states (S1, S2 and S3) of the IC pattern defined in the tape-out data represent various dosage levels (D1, D2, and D3, respectively) during the e-beam lithography exposure process. In furtherance of the embodiment, the first dosage D1 is greater than the second dosage D2 and the second dosage D2 is greater than the third dosage D3. In the present example, the third dosage D3 is around zero.

In an alternative embodiment, after the operation 256, a first tape-out data is generated according to the first layer pattern and a second tape-out data is generated according to the second layer pattern. The first and second tape-out data are used to pattern the first and second mask material layers by respective e-beam lithography exposure processes. Various etch processes are further applied to the first and second material layers to transfer the first and second layer patterns from the first and second resist layers to the first and second mask material layers, respectively, forming the mask 10.

Another embodiment of a mask having three states is provided below. FIG. 23 is a top view of a mask 300 having three states and defines a first layer pattern having a first feature 18, a second layer pattern having second features 20, and a field 22. The first layer pattern, the second layer pattern and the field have different states, such as different transmittances at present embodiment. Especially, the first layer pattern is in a first state having a first transmittance S1, the second layer pattern is in a second state having a second transmittance S2 less than S1, and the field is in a third state having a third transmittance S3 less than S2. Similarly, the mask 300 includes a mask substrate, a first mask material layer and a second mask material having respective transmittance S1, S2 and S3. In one example, the first mask material layer includes MoSi and the second mask material layer includes Cr. Furthermore, the first mask material layer is patterned to define the first layer pattern and the second mask material layer is patterned to define the second layer pattern. In the present case, the first feature 18 spans a first dimension in the X direction and the second features 20 span a second dimension less than the first dimension in the X direction.

FIG. 24 diagrammatically illustrates an exposure intensity profile 310 in a lithography exposure process using the mask 300 to simultaneously pattern a first resist layer and a second resist layer with respective patterns. In the present example, the exposure intensity profile 310 is an exposure intensity profile of the second resist layer. The exposure intensity profile of the first resist layer is similar to the exposure intensity profile 310.

FIG. 25 collectively illustrates a top view of latent resist patterns in respective resist layers by a lithography exposure process using the mask 300. More specifically, a first latent pattern formed in the first resist layer includes a first latent feature 48 associated with the first feature 18, and a second latent pattern formed in the second resist layer includes second latent features 46 associated with the second features 20.

In this embodiment, the first and second biases to the first and second layer patterns are different from those in FIGS. 1 and 2. Accordingly, the second latent feature 46 aligned with the first latent feature 48 have a large dimension along the X direction in the overlapped portion for more alignment window.

Various advantages may present in different embodiments of the present disclosure. In one embodiment, the mask 10 having three states can be used to simultaneously pattern two resist layers with respective latent patterns by a single lithography exposure. In another embodiment, the tunings of the first and second layer patterns have more freedoms including transmittance tuning and size tuning. Although embodiments of the present disclosure have been described in detail, those skilled in the art should understand that they may make various changes, substitutions and alterations herein without departing from the spirit and scope of the present disclosure. For example, the mask 10 may include more three states each having respective transmittance. In furtherance of the embodiment, three mask material layers with respective transmittance are deposited and patterned to define features from three layer patterns, respectively. In another embodiment, the mask 10 may be designed as a reflective mask for extreme UV (EUV) lithography. In this case, the mask substrate 12 includes a low thermal expansion material (LTEM) substrate and the first mask material layer 14 includes reflective multiple layers, such pairs of Mo and Si layers designed to reflect EUV radiation.

Thus, the present disclosure provides one embodiment of a mask for a lithography exposure process. The mask includes a mask substrate; a first mask material layer patterned to have a first plurality of openings that define a first layer pattern; and a second mask material layer patterned to have a second plurality of openings that define a second layer pattern.

The present disclosure also provides an embodiment of a method that includes forming a first resist layer on a semiconductor substrate; forming a second resist layer over the first resist layer; and performing a lithography exposure process to the first resist layer and the second resist layer using a three-state mask, thereby forming a first latent pattern in the first resist layer and a second latent pattern in the second resist layer.

The present disclosure also provides one embodiment of a method that includes receiving an integrated circuit (IC) design structure having a first layer pattern and a second layer pattern, wherein the first layer pattern defines at least a first feature to be formed in a first material layer on a substrate and the second layer pattern defines at least a second feature to be formed in a second material layer disposed on the first material layer; tuning the first feature according to a first bias; tuning the second feature according to a second bias different from the first bias; thereafter combining the first and second features to form a combined IC pattern; and generating a tape-out data that defines the combined IC pattern for mask making.

The present disclosure provides another embodiment of a mask used in a lithography exposure process. The mask includes a mask substrate; a first mask material layer disposed on the mask substrate; and a second mask material layer disposed on the first mask material layer, wherein the first and second mask material layers are patterned to define three states different from each, defining a first layer pattern, a second layer pattern and a field region, respectively.

In one embodiment of the mask, the mask substrate has a first transmittance to an exposure radiation of the lithography exposure process; the first mask material layer has a second transmittance less than the first transmittance; and the second mask material layer has a third transmittance less than the second transmittance. In anther embodiment, the three states include a first state having the first transmittance, a second state having the second transmittance and a third state having the third transmittance. In one example, the first transmittance is 100%; the third transmittance is 0; and the second transmittance ranges between about 20% and about 80%. In yet another embodiment, the first layer pattern includes a first feature defined in a first opening of the first mask material layer; and the second layer pattern includes a second feature defined in a second opening of the second mask material layer. In yet another embodiment, the first mask material layer includes molybdenum silicon (MoSi); and the second mask material layer includes chromium (Cr).

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor device, the method comprising:
   providing a mask, wherein the mask includes:
   a first mask material layer over a mask substrate and patterned to have a first plurality of openings that define a first layer pattern; and
   a second mask material layer over the first mask material layer and patterned to have a second plurality of openings that define a second layer pattern;
   providing a target substrate having a first photoresist layer and a second photoresist layer over the first photoresist layer; and
   performing a lithography exposure by patterning a radiation beam using the provided mask, wherein the first layer pattern is formed on to the first photoresist layer and the second layer pattern is formed on the second photoresist layer.

2. The method of claim 1, wherein the providing the target substrate including providing the first photoresist layer and the second photoresist layer of a positive tone.

3. The method of claim 1, wherein the providing the target substrate includes providing the first photoresist layer of a first exposure threshold and providing the second photoresist layer of a second exposure threshold, wherein the first and second exposure thresholds are different.

4. The method of claim 3, wherein the second exposure threshold is lower than the first exposure threshold.

5. The method of claim 1, wherein the lithography exposure exposes a latent pattern associated with the second layer pattern on the first photoresist layer, the latent pattern formed with an intensity below an exposure threshold of the first photoresist layer.

6. The method of claim 5, further comprising:
   developing the first photoresist layer, wherein the first layer pattern is defined after development and the second layer pattern is not defined on the first photoresist layer.

7. The method of claim 1, wherein the lithography exposure defines a latent pattern associated with the first layer pattern on the second photoresist layer, the latent pattern formed with an intensity above an exposure threshold of the second photoresist layer.

8. A method of fabricating a semiconductor device, the method comprising:
   providing a mask, wherein the mask includes:
   a first mask material layer over a mask substrate and patterned with a first layer pattern of an integrated circuit (IC); and
   a second mask material layer over the first mask material layer and patterned with a second layer pattern of the IC, wherein the first and second layer patterns are different patterns of features of the IC;
   providing a semiconductor substrate having a first photoresist layer and a second photoresist layer over the first photoresist layer, wherein the first and second photoresist layers have a different exposure threshold; and performing a lithography exposure process to the first photoresist layer and the second photoresist layer, thereby forming a first feature of the first layer pattern in the first photoresist layer and a second feature of the second layer pattern in the second photoresist layer.

9. The method of claim 8, wherein the first feature is a via feature.

10. The method of claim 9, wherein the second feature is a line feature.

11. The method of claim 8, further comprising:
developing the first feature of the first photoresist layer; and
developing the second feature of the second photoresist layer.

12. The method of claim 11, further comprising: performing at least one etching step between the developing the first feature and the developing the second feature.

13. The method of claim 11, further comprising:
using the first feature as a masking element to define a via in a first dielectric layer; and
using the second feature as a masking element to define a trench in a second dielectric layer over the first dielectric layer.

14. The method of claim 13, further comprising:
filling the via and the trench with conductive material.

15. A method of semiconductor device fabrication, the method comprising:
providing a semiconductor substrate having a first photoresist layer and an overlying second photoresist layer;
providing a mask having a first layer defining a first pattern and a second layer defining a second pattern, the second pattern different than the first pattern;
using the mask, concurrently exposing the first and the second photoresist layers to form a first latent feature defined by the first pattern on the first photoresist layer and a second latent feature defined by the second pattern on the second photoresist layer;
applying a first developer to develop the second photoresist layer to form a first feature from the second latent feature;
after applying the first developer, applying a second developer, different than the first developer, to develop the first photoresist layer to form a second feature from the first latent feature.

16. The method of claim 15, further comprising:
using the first feature as a masking element while etching a first dielectric layer.

17. The method of claim 16, further comprising:
using the second feature as a masking element while etching a second dielectric layer.

18. The method of claim 17, wherein the etching the first dielectric layer and the second dielectric layer provides a continuous opening defined by the first and second features.

19. The method of claim 18, further comprising:
filling the continuous opening with a conductive material.

20. The method of claim 15, wherein the first photoresist layer is indissoluble in the first developer.

* * * * *